(12) United States Patent
Chen et al.

(10) Patent No.: US 9,640,496 B2
(45) Date of Patent: May 2, 2017

(54) SEMICONDUCTOR DEVICE

(71) Applicant: TAIWAN SEMICONDUCTOR MANUFACTURING COMPANY LTD., Hsinchu (TW)

(72) Inventors: Wei-Yu Chen, New Taipei (TW); Hsien-Wei Chen, Hsinchu (TW); An-Jhih Su, Taoyuan County (TW); Cheng-Hsien Hsieh, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/857,549

(22) Filed: Sep. 17, 2015

(65) Prior Publication Data

US 2017/0084556 A1 Mar. 23, 2017

(51) Int. Cl.
*H01L 23/00* (2006.01)
(52) U.S. Cl.
CPC .............. *H01L 24/05* (2013.01); *H01L 24/03* (2013.01); *H01L 24/11* (2013.01); *H01L 24/13* (2013.01); *H01L 2224/024* (2013.01); *H01L 2224/0231* (2013.01); *H01L 2224/0236* (2013.01)
(58) Field of Classification Search
CPC ....... H01L 22/12; H01L 21/78; H01L 23/544; H01L 23/00; H01L 24/11; H01L 23/03; H01L 24/05; H01L 24/13; H01L 24/03; H01L 2224/0231; H01L 2224/0236; H01L 2224/024
USPC ........ 257/774, 737, 773, 698, 696, 734, 738
See application file for complete search history.

(56) References Cited

U.S. PATENT DOCUMENTS

| | | | | |
|---|---|---|---|---|
| 2001/0007375 | A1* | 7/2001 | Fjelstad | H01L 23/3114 257/773 |
| 2007/0152310 | A1* | 7/2007 | Osborn | H01L 24/24 257/678 |
| 2012/0263244 | A1* | 10/2012 | Kyles | H01L 23/49861 375/259 |
| 2014/0091473 | A1* | 4/2014 | Len | H01L 24/05 257/774 |
| 2016/0141213 | A1* | 5/2016 | Bishop | H01L 22/12 438/16 |

\* cited by examiner

*Primary Examiner* — Alexander Oscar Williams
(74) *Attorney, Agent, or Firm* — WPAT, P.C.; Anthony King; Kay Yang

(57) ABSTRACT

A semiconductor device includes a semiconductor substrate, and a redistribution layer (RDL) over the semiconductor substrate and configured to receive a bump. The semiconductor device further includes a polymeric material over the RDL, and the polymeric material includes an opening to expose a portion of the RDL. In the semiconductor device, a barrier is covering a joint between the polymeric material and the RDL.

17 Claims, 43 Drawing Sheets

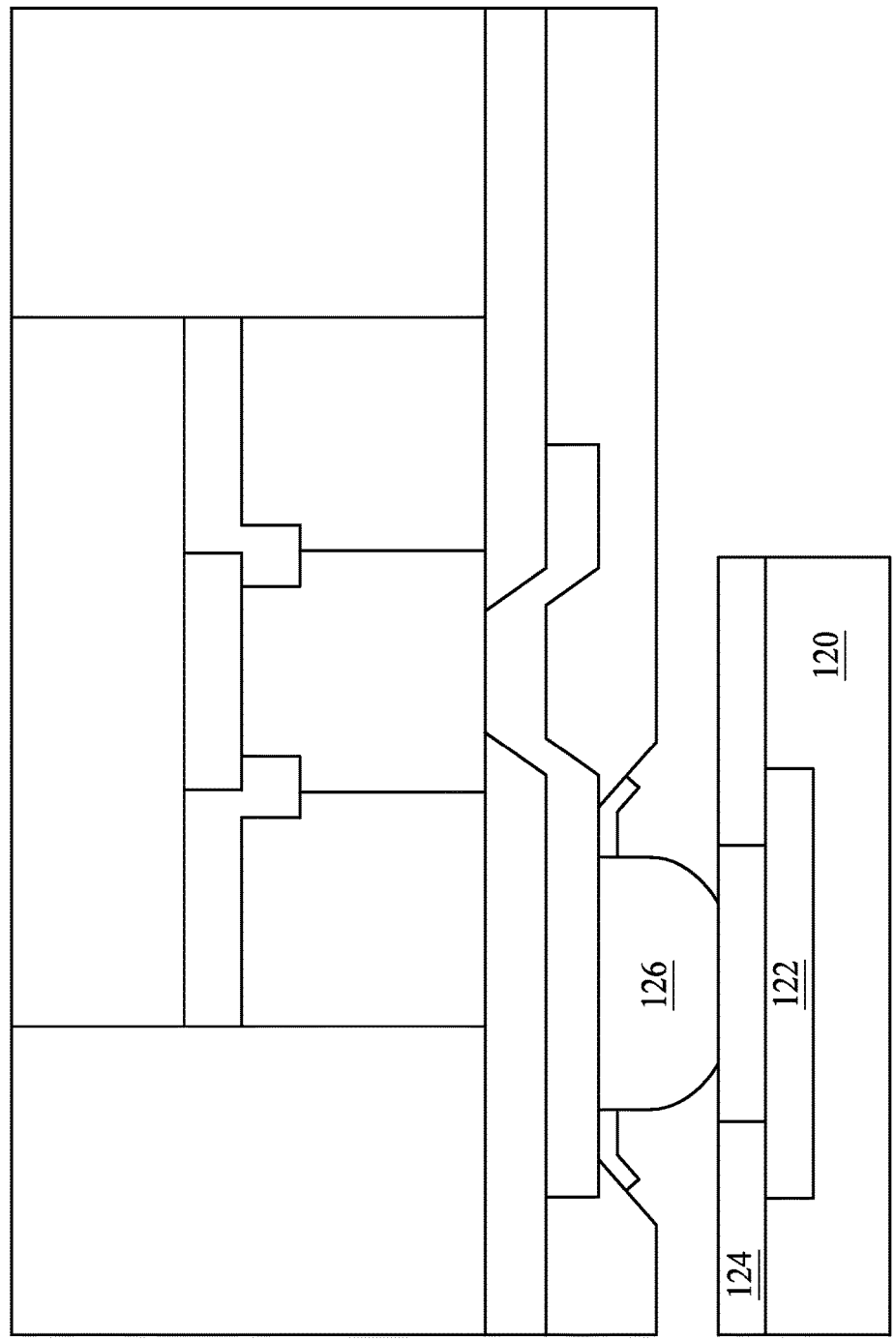

SEMICONDUCTOR DEVICE

PRIORITY CLAIM AND CROSS-REFERENCE

The disclosure relates to a semiconductor device and a method of manufacturing a semiconductor device.

BACKGROUND

Electronic equipments involving semiconductor devices are indispensable from our daily life. With the advancement of electronic technology, electronic equipments become more complicated and involve greater amount of integrated circuitry for executing the desired multi-functionality. Thus, manufacturing of the electronic equipments includes more and more steps of assembly and processing as well as materials for producing the semiconductor devices in the electronic equipments. Therefore, there is a continuous demand on simplifying the steps of production, increasing production efficiency and lowering associated manufacturing cost on each electronic equipment.

During the operations of manufacturing the semiconductor devices, the semiconductor devices are assembled with numbers of integrated components including various materials with difference in thermal properties. As such, the integrated components are in undesired configurations. The undesired configurations would lead to yield loss of the semiconductor devices, poor bondability between the components, development of cracks, delamination of the components or etc. Furthermore, the components of the semiconductor devices include various metallic materials which are in limited quantity and thus in a high cost. The undesired configurations of the components and the yield loss of the semiconductor devices would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3b is a top view of FIG. 3a.

FIG. 4b is a top view of FIG. 4a

FIG. 5A-FIG. 5M are operations of a method of manufacturing a semiconductor device in accordance with some embodiments.

DETAILED DESCRIPTION

Figure 1:
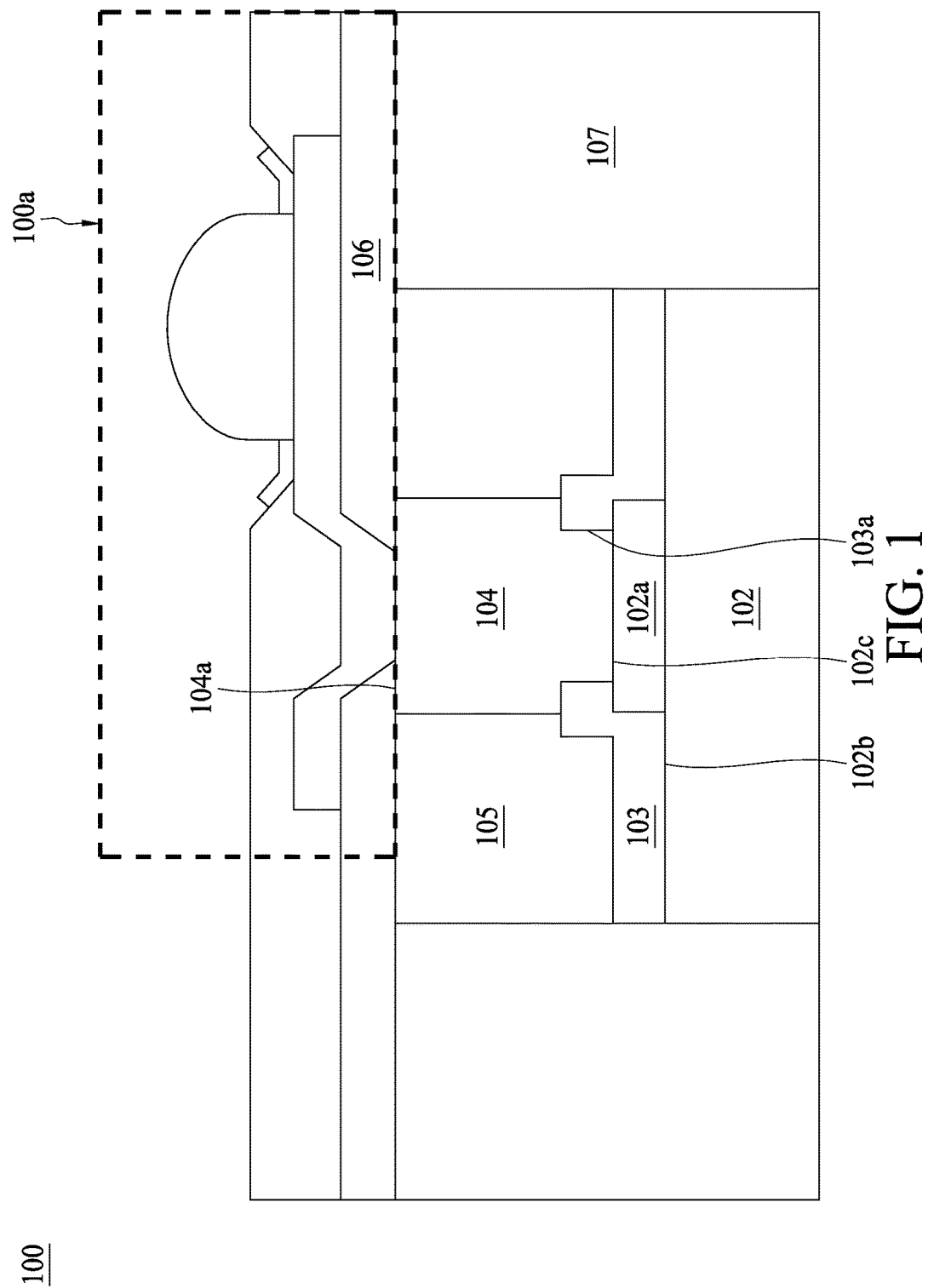
FIG. 1 is a schematic view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
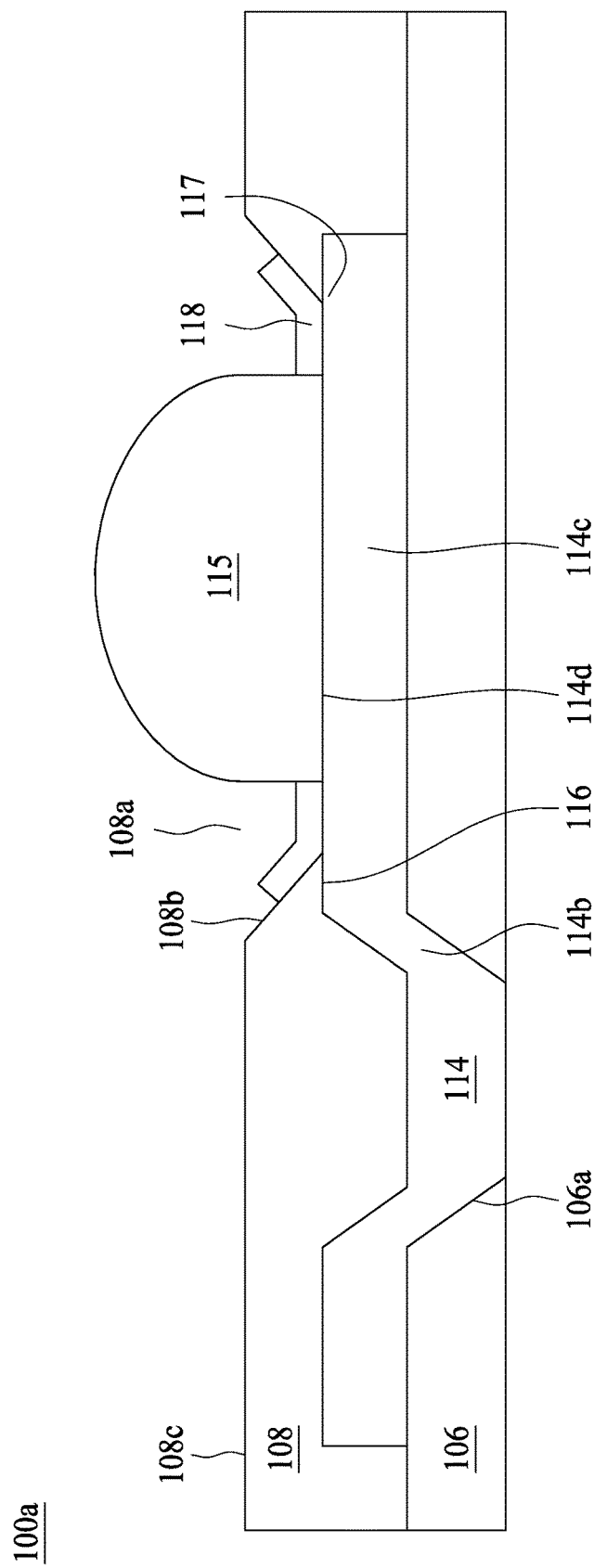
FIG. 1a is an enlarged view of a portion of a semiconductor device in FIG. 1 in accordance with some embodiments.

FIG. 1 is an embodiment of a semiconductor device 100, and 100a is a portion of the semiconductor device 100 in FIG. 1. FIG. 1a is an enlarged view of 100a. Semiconductor device 100 includes a semiconductor substrate 102. In some embodiments, the semiconductor substrate 102 includes semiconductor materials such as silicon, and is fabricated with a predetermined functional circuit within the semiconductor substrate 102 produced by various operations such as photolithography, etch, deposition, plating, etc. In some embodiments, the semiconductor substrate 102 is singulated from a silicon wafer by a mechanical or laser blade. In some embodiments, the semiconductor substrate 102 is in a quadrilateral, a rectangular or a square shape.

The semiconductor substrate 102 includes a surface 102b and a conductive pad 102a is disposed on the surface 102b. In some embodiments, the conductive pad 102a is electrically connected with a circuitry external to the semiconductor substrate 102, so that a circuitry internal to the semiconductor substrate 102 electrically connects with the circuitry external to the semiconductor substrate 102 through the conductive pad 102a. In some embodiments, the conductive pad 102a is configured for electrically coupling with a conductive bump through a conductive trace attached on the conductive pad 102a, so that the circuitry internal to the semiconductor substrate 102 connects with the circuitry external to the semiconductor substrate 102 from the conductive pad 102a to the conductive bump through the conductive trace. In some embodiments, the conductive pad 102a includes gold, silver, copper, nickel, tungsten, aluminum, palladium and/or alloys thereof.

In some embodiments, a passivation 103 is disposed on the surface 102b of the semiconductor substrate 102 and over the conductive pad 102a. In some embodiments, the passivation 103 surrounds the conductive pad 102a. In some embodiments, the passivation 103 partially covers a top surface 102c of the conductive pad 102a. The passivation 103 is configured for providing an electrical insulation and a moisture protection for the semiconductor substrate 102, so that the semiconductor substrate 102 is isolated from ambient environment. In some embodiments, the passivation 103 is formed with dielectric materials such as spin-on glass (SOG), silicon oxide, silicon oxynitride, silicon nitride or the like. In some embodiments, the passivation 103 is formed with a vapor deposition or a spin coating process.

In some embodiments, the passivation 103 includes an opening 103a above the conductive pad 102a for exposing a portion of the top surface 102c of the conductive pad 102a and thus for electrically connecting the conductive pad 102a with the circuitry external to the semiconductor substrate 102 through the conductive trace.

In some embodiments, a conductor 104 is disposed over the top surface 102c of the conductive pad 102a as in FIG. 1. In some embodiments, the conductor 104 is on an exposed portion of the top surface 102c and a portion of the passivation 103 adjacent to the opening 103a. The conductor 104 is extended from the exposed portion of the top surface 102c to a top surface 104a of the conductor 104 as in FIG. 1. In some embodiments, the conductor 104 is extended along a normal direction of the surface 102b. In some embodiments, the conductor 104 is substantially upright and supported by the conductive pad 102a.

In some embodiments, the conductor 104 is in a cylindrical shape with various cross-sectional shapes such as circular shape, quadrilateral shape or polygonal shape. In addition, a wide variety of materials is selected for the conductor 104 such as metal or metal alloy. In some embodiments, the conductor 104 includes copper (Cu), gold (Au), platinum (Pt), titanium (Ti), nickel (Ni), aluminum (Al), etc.

In some embodiments, a dielectric 105 is disposed over the passivation 103 and surrounding the conductor 104. The dielectric 105 is a dielectric filling inserted around the conductor 104 in order to isolate adjacent conductors or avoid moisture attack. In some embodiments, the dielectric 105 includes a material such as epoxy, polyimide, polybenzoxazole (PBO), solder resist (SR), ABF film, and the like. In some embodiments, the conductor 104 and dielectric 105 are substantially coplanar.

In some embodiments, a molding 107 is disposed to surround the semiconductor substrate 102. In some embodiments, the molding 107 is disposed adjacent to a sidewall 102d of the semiconductor substrate 102. In some embodiments, top surfaces of the conductor 104, dielectric 105 and the molding 107 are substantially coplanar.

In some embodiments, a dielectric 106 is disposed over the molding 107, the conductor 104 and the dielectric 105. The dielectric 106 is disposed on top surfaces of the molding 107, the conductor 104 and the dielectric 105. In some embodiments, the dielectric 106 includes a polymeric material such as epoxy, polyimide, polybenzoxazole (PBO), solder resist (SR), ABF film, and the like.

In some embodiments, a recessed portion 106a of the dielectric 106 is configured for receiving a redistribution layer (RDL) 114. The RDL 114 is an electrical conductive layer configured as an intermediate path between the conductor 104 and an external circuitry. The RDL 114 includes several sections. One section 114b is connected with conductor 104 and one section 114c is configured to provide a terminal for connecting with the external circuitry. In some embodiments, section 114b is conformally lining along the recess portion 106a of the dielectric such that a portion of section 114b is below section 114c. The RDL 114 is partially covered by a dielectric 108, which is designed to isolate the RDL 114 from moisture or reaction. However, at least a portion of section 114c is exposed from the dielectric 108. The dielectric 108 has an opening 108a to expose a portion of section 114c so as to provide a top surface 114d for receiving a conductive bump 115. In some embodiments, a under bump metallurgy (UBM) may be disposed between the RDL 114 and the bump 115. The dielectric 108 includes a polymeric material such as epoxy, polyimide, polybenzoxazole (PBO), solder resist (SR), ABF film, and the like.

The opening 108a has a sidewall 108b running from the top surface 108c of dielectric 108 down to the top surface 114d of RDL 114. A point (or a continuous line from an expanded view) 117 where the sidewall 108b and RDL 114 meets, or called joint, is a location most vulnerable to any attack from proceeding operations. For example, while forming the bump 115 on the top surface 114d of the RDL 114, a flux may be applied to treat the top surface prior to drop the bump 115 on the top surface 114d. The flux may penetrate into the interface 116, which is between the dielectric 108 and the RDL 114, from joint 117. The flux penetration can generate undesired reaction between the flux and the RDL 114 or the dielectric 108 thus causing a fatal delamination. For another example, a heat treatment may be performed after the bump 115 is dropped on the top surface 114d. The bump 115 may be partially reflowed and penetrates into the interface 116 through joint 117. Once the conductive bump material flows into the interface 116 and forms an undesired layer with the RDL 114 or the dielectric 108, a film integrity fatal failure may occur.

In order to prevent the undesired foreign material penetration, a barrier 118 is disposed proximal to the RDL 114. In an embodiment, the barrier 118 further covers the joint 117 as in FIGS. 1 and 1a. The barrier 118 prevents joint (like 117) of dielectric 108 and RDL 114 being exposed to the opening 108a. Therefore, the barrier 118 is a seal configured to cover the joint 117 and prevents aforementioned foreign material in the opening 108a penetrating into the interface 116. In some embodiments, the barrier 118 is a layer covering and lining around the joint 117 as shown in FIG. 1a. The barrier 118 lines conformally on the topography formed by the RDL 114 and the dielectric 108. The lining barrier 118 covers a portion of the sidewall 108b and a portion of the RDL 114. In some embodiments, the barrier 118 further extends along the sidewall 108b and meets with the top surface 108c of the dielectric 108. On the other end, the extension of the lining barrier 118 may fall on the top surface 114d.

The barrier 118 is selected from a material which has a higher etch resistance to the material used as an oxide remover for the RDL 114. The oxide remover is used to remove oxide film formed on top surface 114d of the RDL 114 before disposing the bump 115. In some embodiment, the oxide remover may include hydrochloric acid to remove native oxide formed on the top surface 114d in order to optimize the contact between the RDL 114 and bump 115. However the oxide remover has an etch selectivity between the oxide compound of RDL 114 and the barrier 118 or its oxide compound. The etch rate on the barrier 118 or its oxide compound is two times lower than the oxide compound of RDL 114 against the oxide remover, thus the joint 117 is well protected under the oxide removing operation. In some embodiment, the oxide remover is also called flux. In some embodiments, the etch rate on the barrier 118 or its oxide compound may be five times lower than the oxide compound of RDL 114 against the oxide remover.

In an embodiment, the RDL 114 is substantially made with copper (Cu). An undesired native copper oxide film may be formed on the exposed surface (like 114d) before performing the bump formation. Thus, an oxide remover is introduced to treat the exposed RDL surface to acquire a fresh surface before dropping the bump thereon. Since the oxide remover, such as flux, is globally applied on the exposed surface, the oxide removing resistance of the barrier 118 ensures that the oxide remover does not penetrate into the interface 116 through the joint 117. In some embodiments, the barrier 118 may also be oxidized as well before dropping the bump; however, because the oxide compound of the barrier 118 also possesses a high resistance to the oxide remover, the joint 117 is also well sealed.

Since the oxide remover or flux used to treat the top surface 114d may vary according to different applications, the material selected for the barrier 118 is dependent on the etch selectivity desired between barrier 118 and the RDL 114, or their oxide compound respectively. In some embodiments, the etch rate for the RDL 114 is about 5 times greater than the etch rate of the barrier 118. In some embodiments, the etch rate for the RDL 114 is about 10 times greater than the etch rate of the barrier 118. In some embodiments, the etch rate for the RDL 114 is about 15 times greater than the etch rate of the barrier 118. As mentioned above, the present disclosure provides various options of the barrier 118 to meet the aforementioned requirements. In an embodiment, the barrier 118 includes titanium (Ti), aluminum (Al), or alloy thereof.

In some embodiments, the barrier 118 is selected from a material which is more passive to the material used for the bump 115 than the RDL 114. In other words, the bump 115 is easier to react with the RDL 114 to form a compound than the barrier 118. Without the barrier 118, a portion of the bump 115 may extend into the interface 116 through the joint 117 and further reacts with the RDL 114 underneath the dielectric 108. With the barrier 118, the joint 117 is sealed and the penetration is prohibited. The material selected for the barrier 118 is dependent on the reactivity selectivity desired between barrier 118 and the RDL 114, or their oxide compound respectively. In some embodiments, the reaction rate for the RDL 114 is about 10 times greater than the reaction rate of the barrier 118. In some embodiments, the reaction rate for the RDL 114 is about 15 times greater than the reaction rate of the barrier 118. As mentioned above, the present disclosure provides various options of the barrier 118 to meet the aforementioned requirements. In an embodiment, the RDL includes copper (Cu), and the barrier 118 includes titanium (Ti), aluminum (Al), or alloy thereof.

Figure 2:
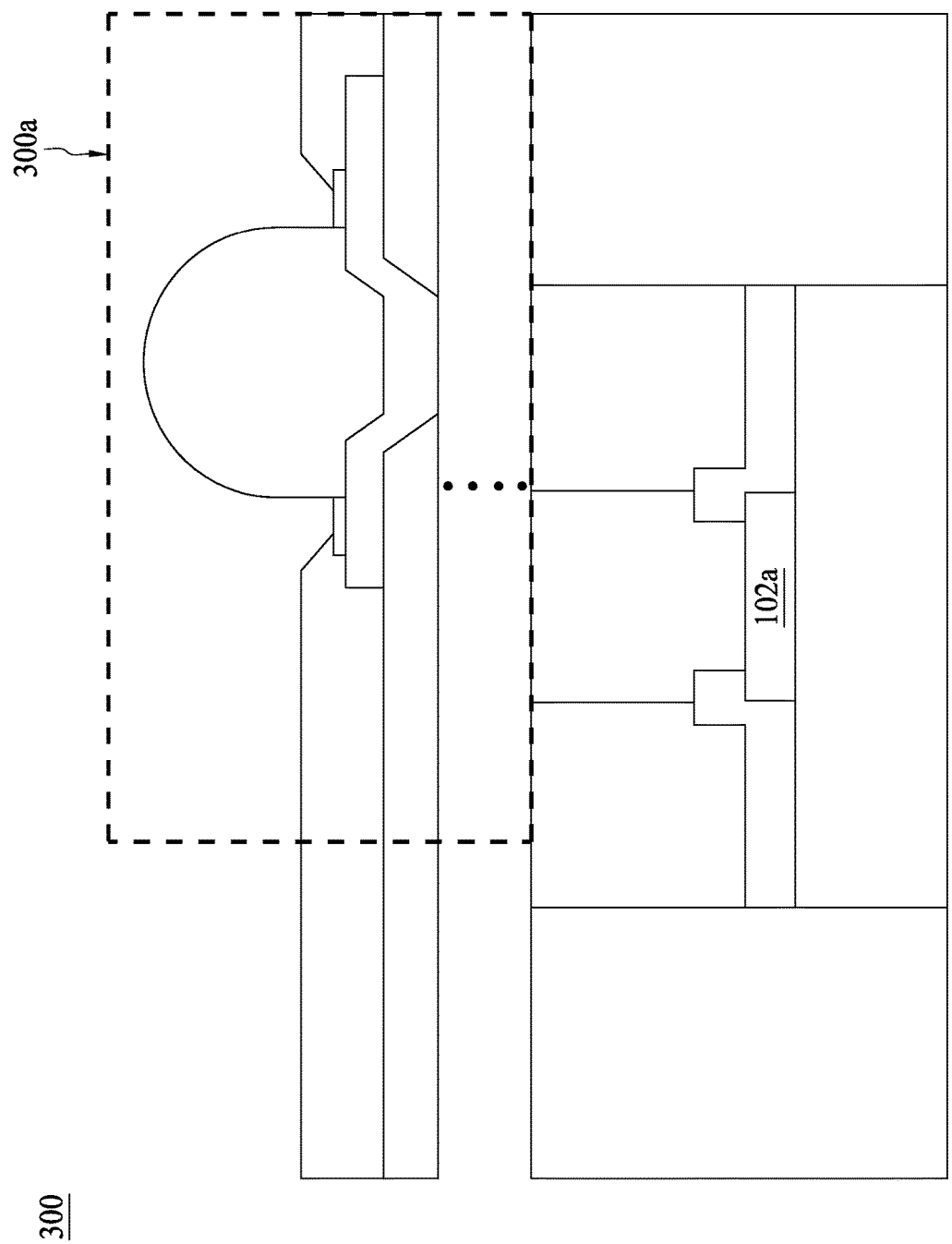
FIG. 2 is a schematic view of a semiconductor device in accordance with some embodiments.
Figure 2A:
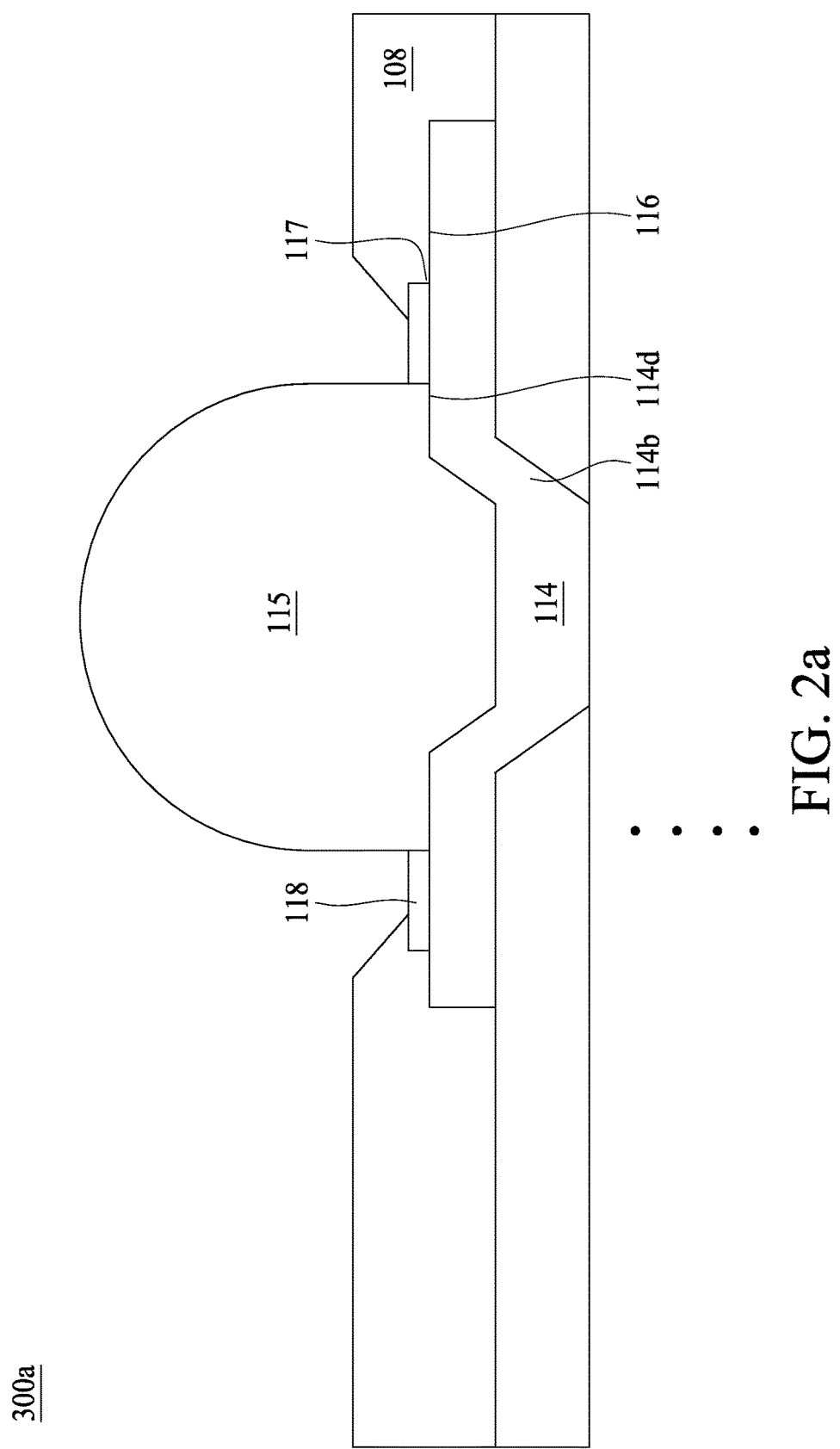
FIG. 2a is an enlarged view of a portion of a semiconductor device in FIG. 2 in accordance with some embodiments.

FIG. 2 is an embodiment of a semiconductor device 300, and 300a is a portion of the semiconductor device 300 in FIG. 2. FIG. 2a is an enlarged view of 300a. The semiconductor device 300 includes a structure similar to the semiconductor 100 in FIG. 1 such that details of the elements indicated with the same numerical labels are not repeated herein. In some embodiments, the semiconductor device 300 may include multiple levels of dielectric and RDL. In some embodiments, the multiple levels of RDL form a conductive trace to electrically connect the conductive pad 102a with the bump 115. In some embodiments, the bump 115 may be disposed on a section 114b of the RDL 114. For the embodiment of FIG. 2, the barrier 118 is disposed in a different configuration from the device 100 in FIG. 1. The barrier 118 dose not line along the sidewall 108b as the barrier in FIG. 1a. Instead, the barrier 118 is disposed on the top surface 114d and further extended to be sandwiched by the dielectric 108 and the RDL 114. The barrier 118 prevents joint (like 117) of dielectric 108 and RDL 114 being exposed to the opening 108a. Thus foreign material introduced during aforementioned oxide removing or bump formation operation cannot penetrate into the interface 116.

Figure 3:
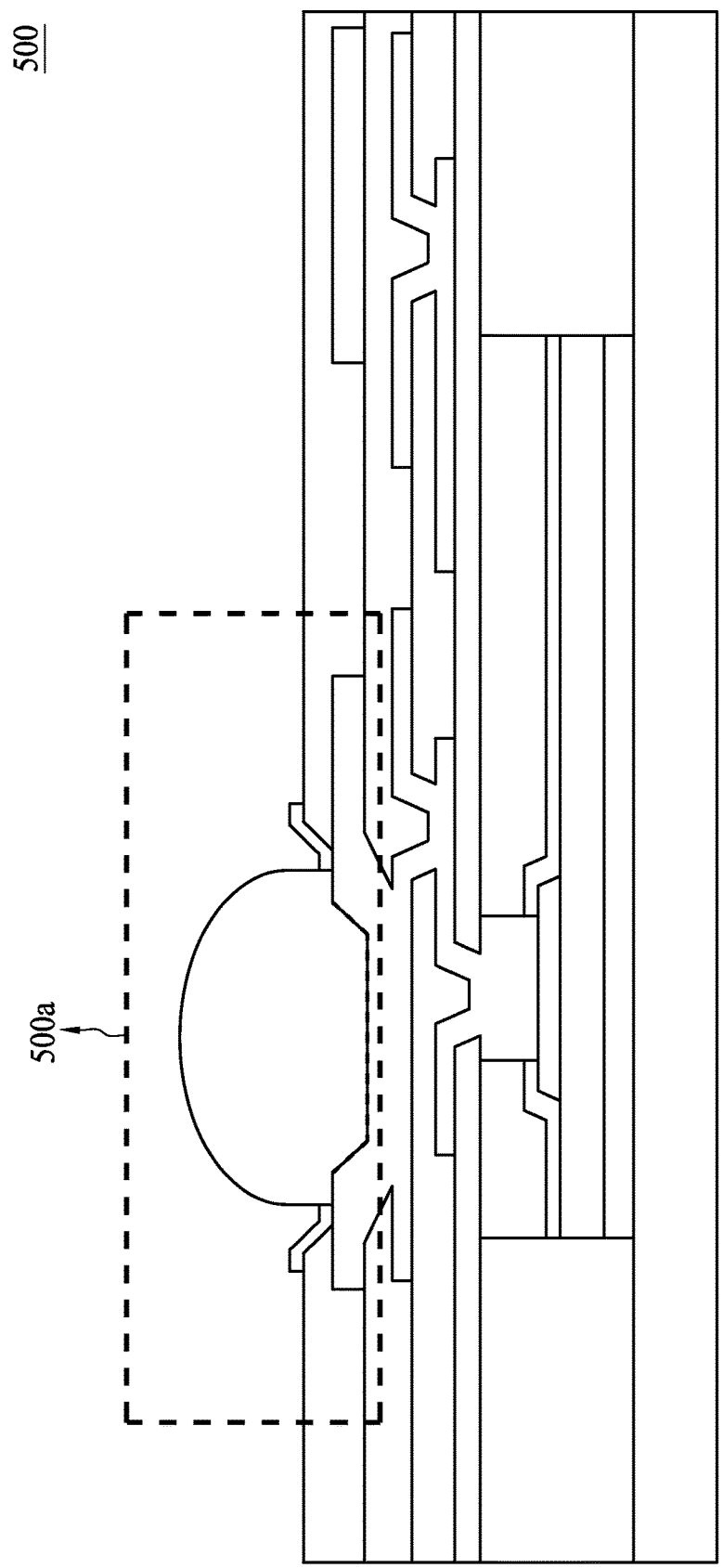
FIG. 3 is a schematic view of a semiconductor device in accordance with some embodiments.
Figure 3A:
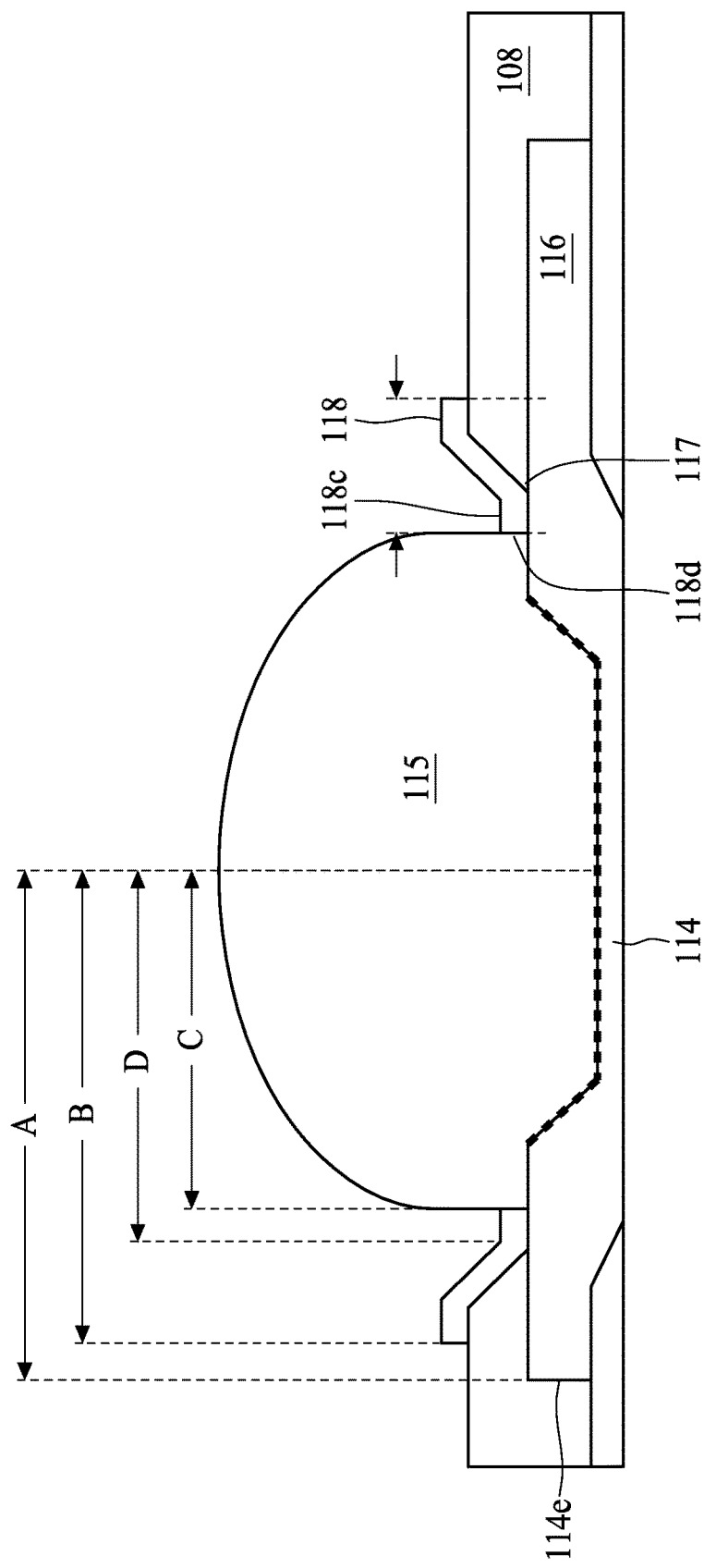
FIG. 3a is an enlarged view of a portion of a semiconductor device in FIG. 3 in accordance with some embodiments.
Figure 3B:
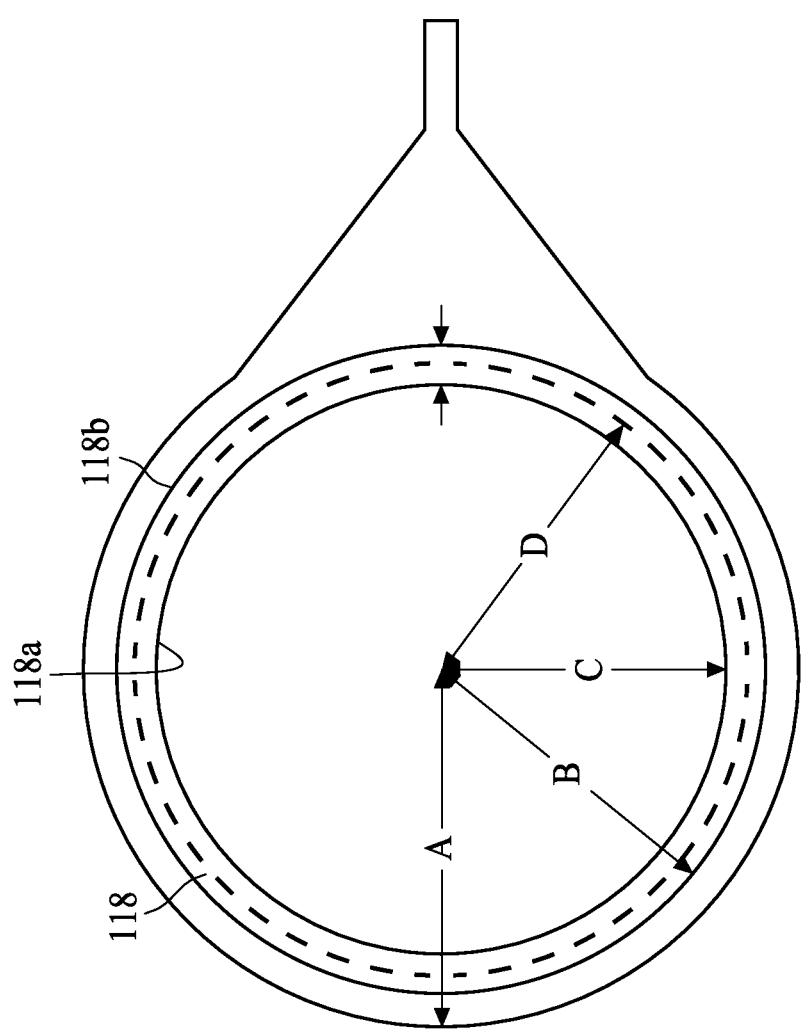

FIG. 3 is an embodiment of a semiconductor device 500, and 500a is a portion of the semiconductor device 500 in FIG. 3. FIG. 3a is an enlarged view of 500a. FIG. 3b is a top view of 500a. The semiconductor device 500 includes a structure similar to the semiconductor 100 in FIG. 1 such that details of the elements indicated with the same numerical labels are not repeated herein. In some embodiments, the RDL 114 is formed like a bird's beak from the top view. In some embodiments, the barrier 118 is surrounding and circumscribing the bump 115. In some embodiments, the barrier 118 includes an inner circle 118a and an outer circle 118b. In FIG. 3a, "A" is defined as a distance between a center line of the bump 115 and a sidewall 114e of the RDL 114; "B" is defined as a distance between a center line of the bump 115 and the outer circle 118b; "D" is defined as a distance between a center line of the bump 115 and the joint 117; and "C" is defined as a distance between a center line of the bump 115 and the inner circle 118a. In some embodiments, A is greater than B, and B is greater than the distance D. In some embodiments, D is greater than the distance C. In some embodiments, the distance of C minus D is about 10 to 25 um. In some embodiments, the distance of C minus D is about 15 to 20 um. In some embodiments, the barrier 118 has a thickness range from 50 nm to 200 nm. In some embodiments, the bump 115 contacts a sidewall 118d of the barrier 118. In some embodiments, the bump 115 is only in contact with the sidewall 118d and not in contact with a top surface 118c of the barrier 118.

Figure 4:
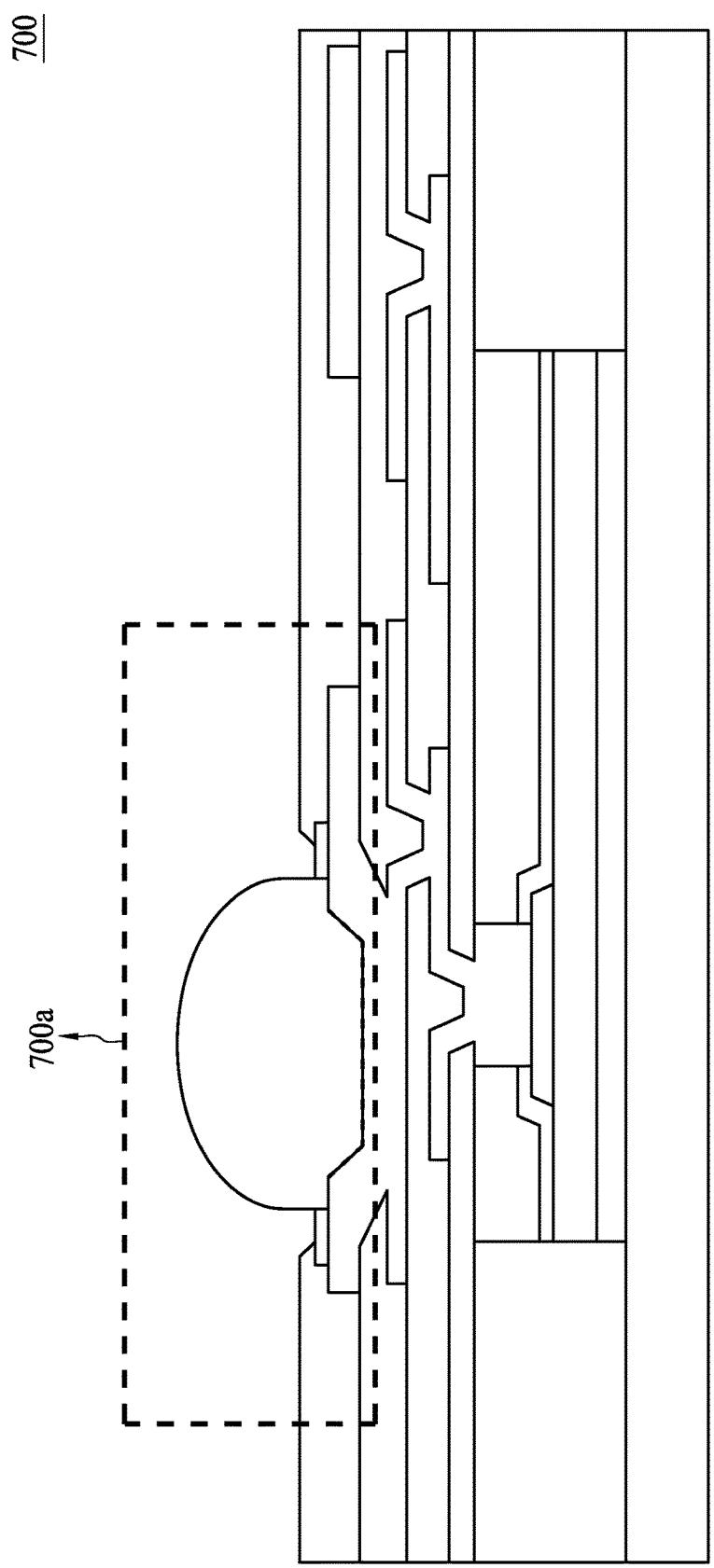
FIG. 4 is a schematic view of a semiconductor device in accordance with some embodiments.
Figure 4A:
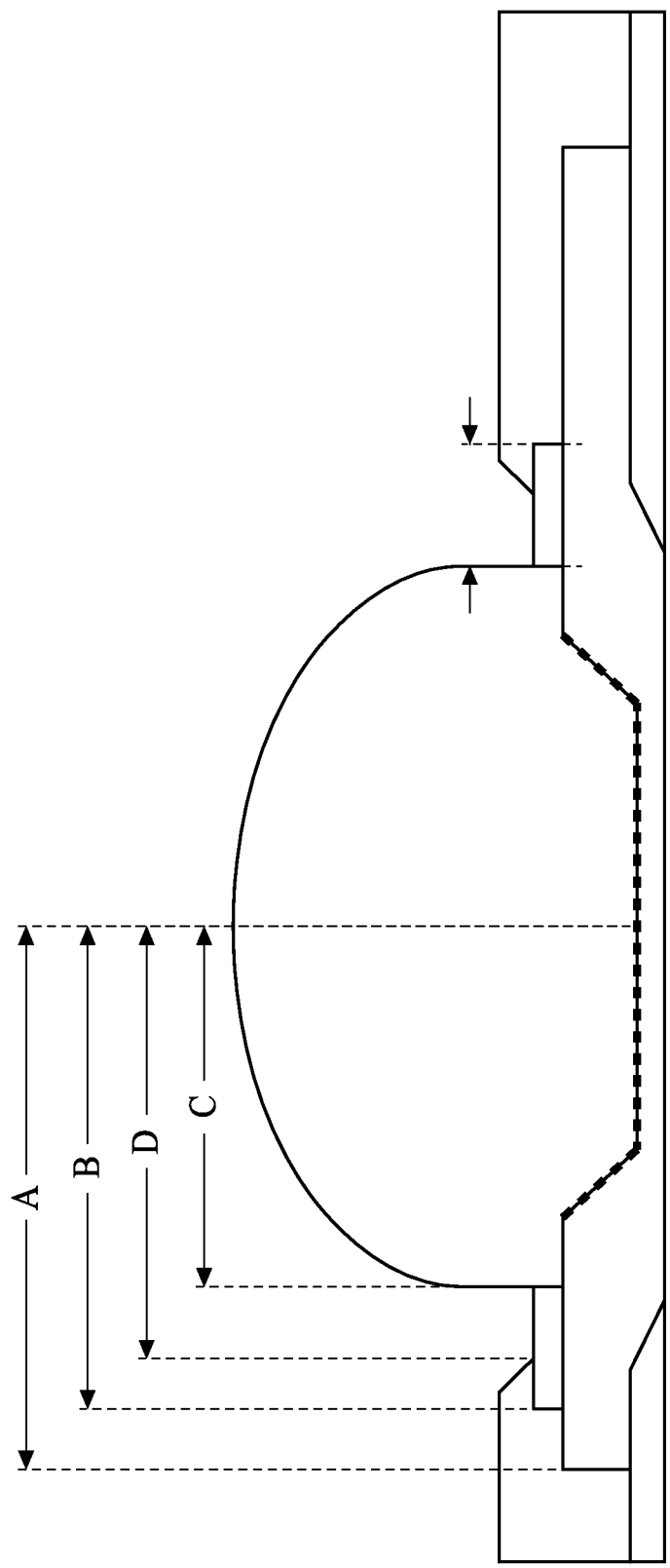
FIG. 4a is an enlarged view of a portion of a semiconductor device in FIG. 4 in accordance with some embodiments.
Figure 4B:
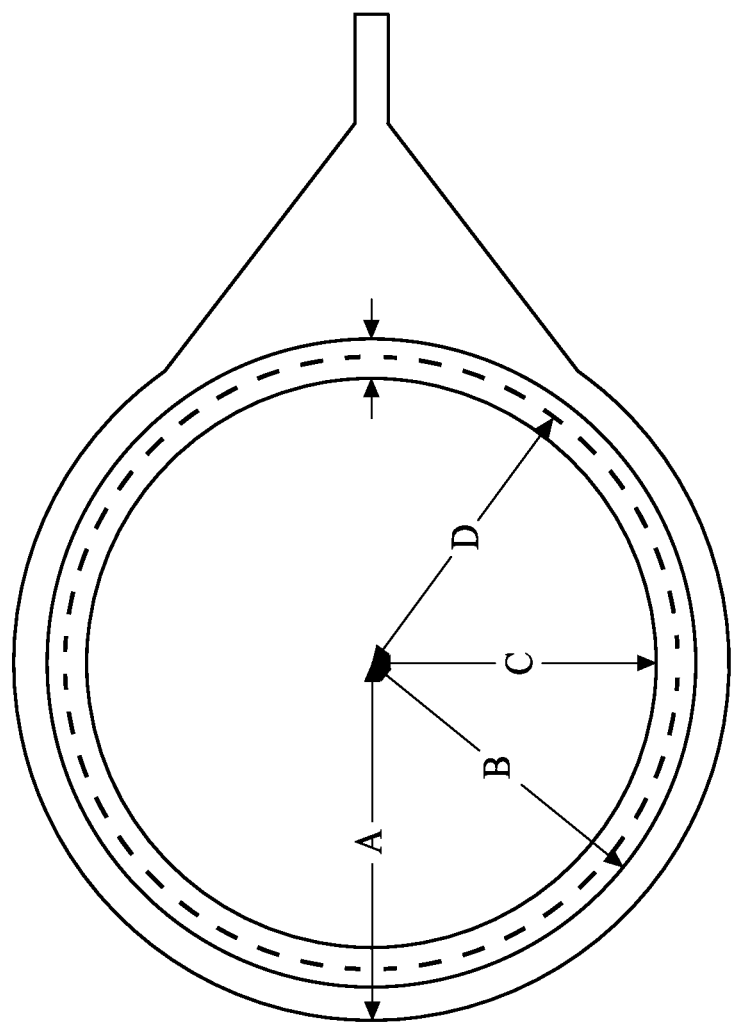

FIG. 4 is an embodiment of a semiconductor device 700, and 700a is a portion of the semiconductor device 700 in FIG. 4. FIG. 4a is an enlarged view of 700a. FIG. 4b is a top view of 700a. The semiconductor device 700 includes a structure similar to the semiconductor 500 in FIG. 3 such that details of the elements indicated with the same numerical labels are not repeated herein. In some embodiments, A is greater than B, and B is greater than the distance D. In some embodiments, D is greater than the distance C. In some embodiments, the distance of C minus D is about 10 to 25 um. In some embodiments, the distance of C minus D is about 15 to 20 um.

FIG. 5A-FIG. 5L includes operations of a method of manufacturing the semiconductor device 100 in FIG. 1. The method includes a number of operations (201, 202, 203, 204, 205, 206, 207, 208, 209, 210, 211 and 212).

Figure 5A:
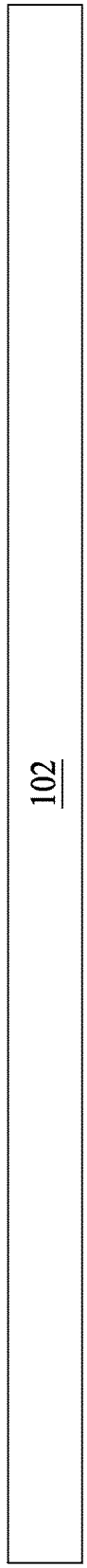
Figure 5B:
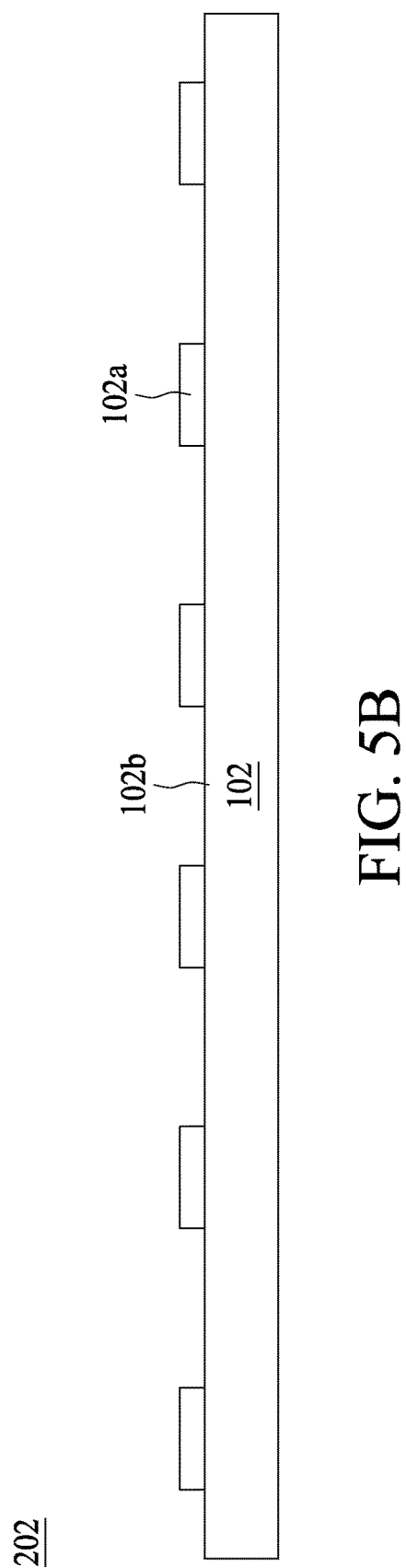

In operation 201, a semiconductor substrate 102 is provided as in FIG. 5A. In some embodiments, the semiconductor substrate 102 includes semiconductor material such as silicon. In operation 202, a conductive pad 102a is formed on the semiconductor substrate 102 as in FIG. 5B. In some embodiments, the conductive pad 102a is disposed on a surface 102b of the semiconductor substrate 102.

Figure 5C:
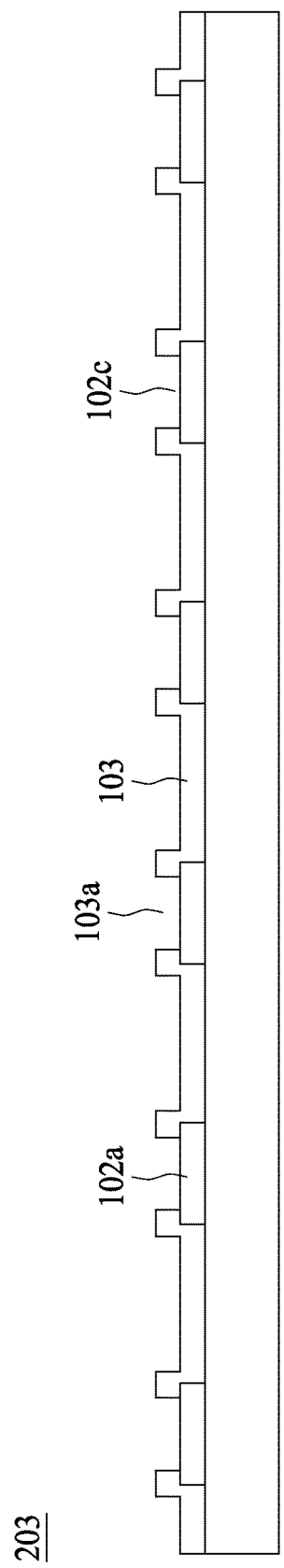

In operation 203 as in FIG. 5C, a passivation 103 is disposed over the semiconductor substrate 102, and some of the passivation 103 is removed to form an opening 103a and some of the passivation 103 above a top surface 102c of the conductive pad 102a is removed by etching operations to expose the top surface 102c of the conductive pad 102a and form the opening 103a. In some embodiments, the opening 103a is extended from a top surface 103b of the passivation 103 to the top surface 102c of the conductive pad 102a.

Figure 5D:
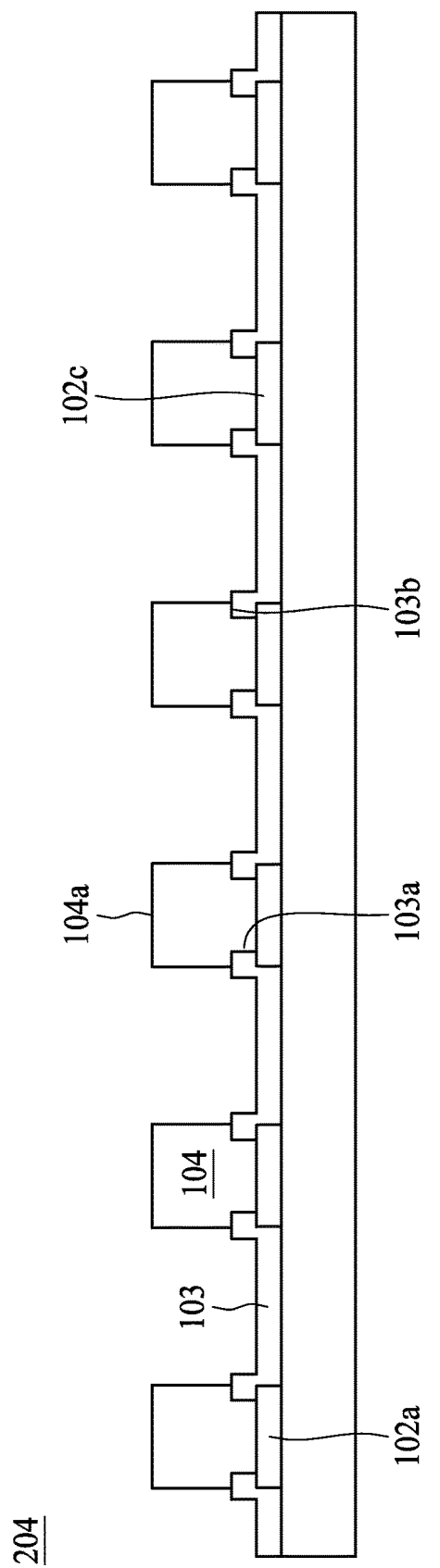

In operation 204, a conductor 104 is disposed over the die pad 102a and a portion of the passivation 103 as in FIG. 5D. In some embodiments, the conductor 104 fills the opening 103a and a portion of the top surface 103b of the passivation 103 that is adjacent to the opening 103a. In some embodiments, the conductor 104 is extended from an exposed portion of the top surface 102c of the die pad 102a to a top surface 104a of the conductor 104. In some embodiments, the conductor 104 is substantially upright and supported by the die pad 102a. In some embodiments, the conductor 104 is disposed by various methods such as electroplating, sputtering or etc. In some embodiments, the conductor 104 includes a metal such as copper.

Figure 5E:
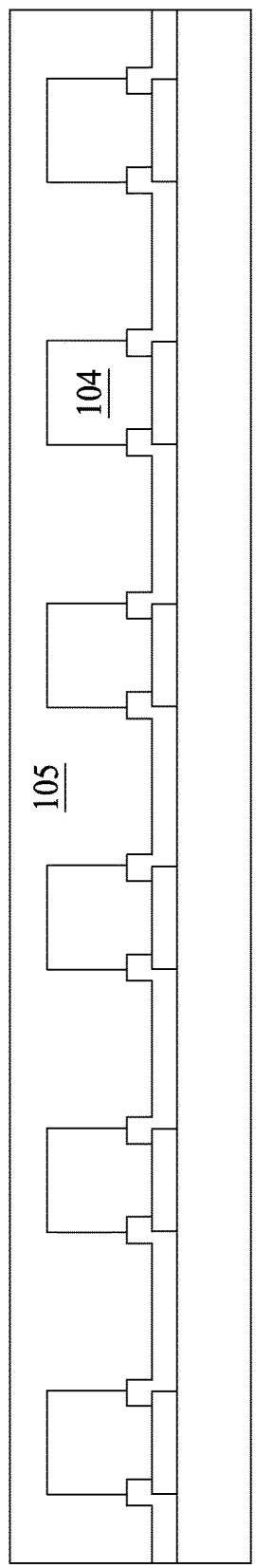

In operation 205, a dielectric 105 is disposed around the conductor 104 as in FIG. 5E. In some embodiments, the dielectric 105 surrounds the conductor 104. The dielectric 105 is configured to insulate the conductor 104 from ambient. In some embodiments, the dielectric 105 includes a polymeric material such as epoxy, polyimide, polybenzoxazole (PBO), solder resist (SR), ABF film, and the like.

Figure 5F:
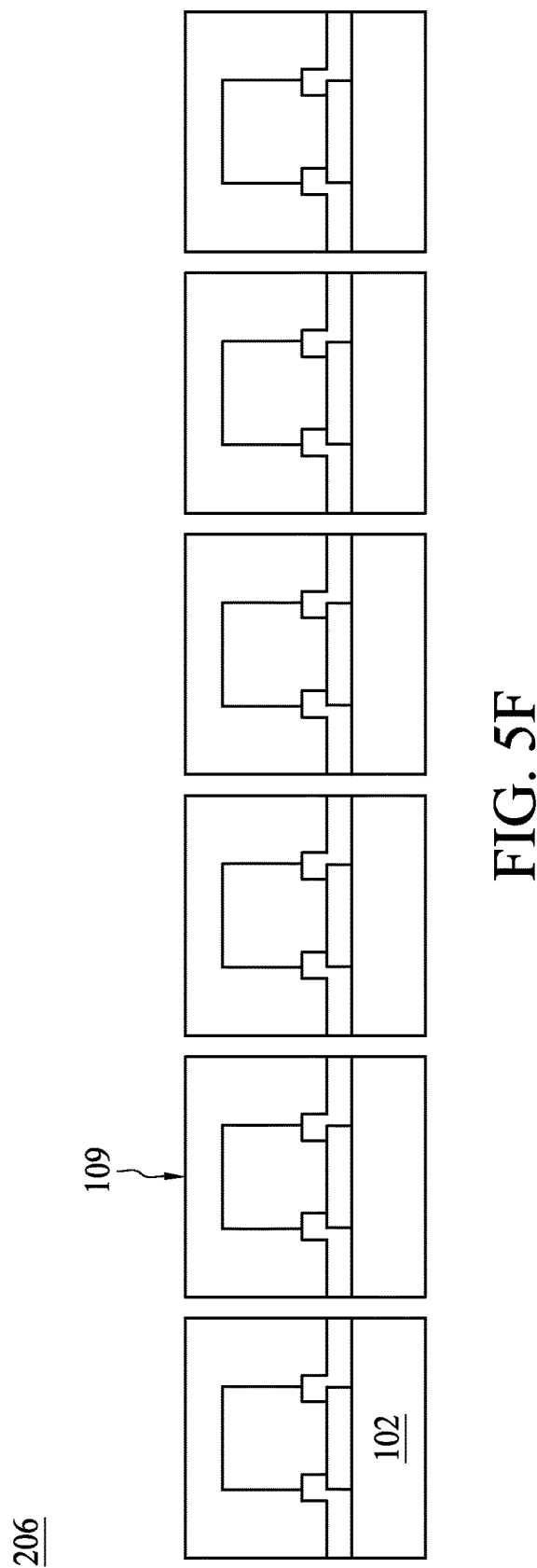

In operation 206, the semiconductor substrate 102 is singulated into several individual dies 109 as in FIG. 5F. In some embodiments, the semiconductor substrate 102 is singulated by a mechanical or laser blade.

Figure 5G:
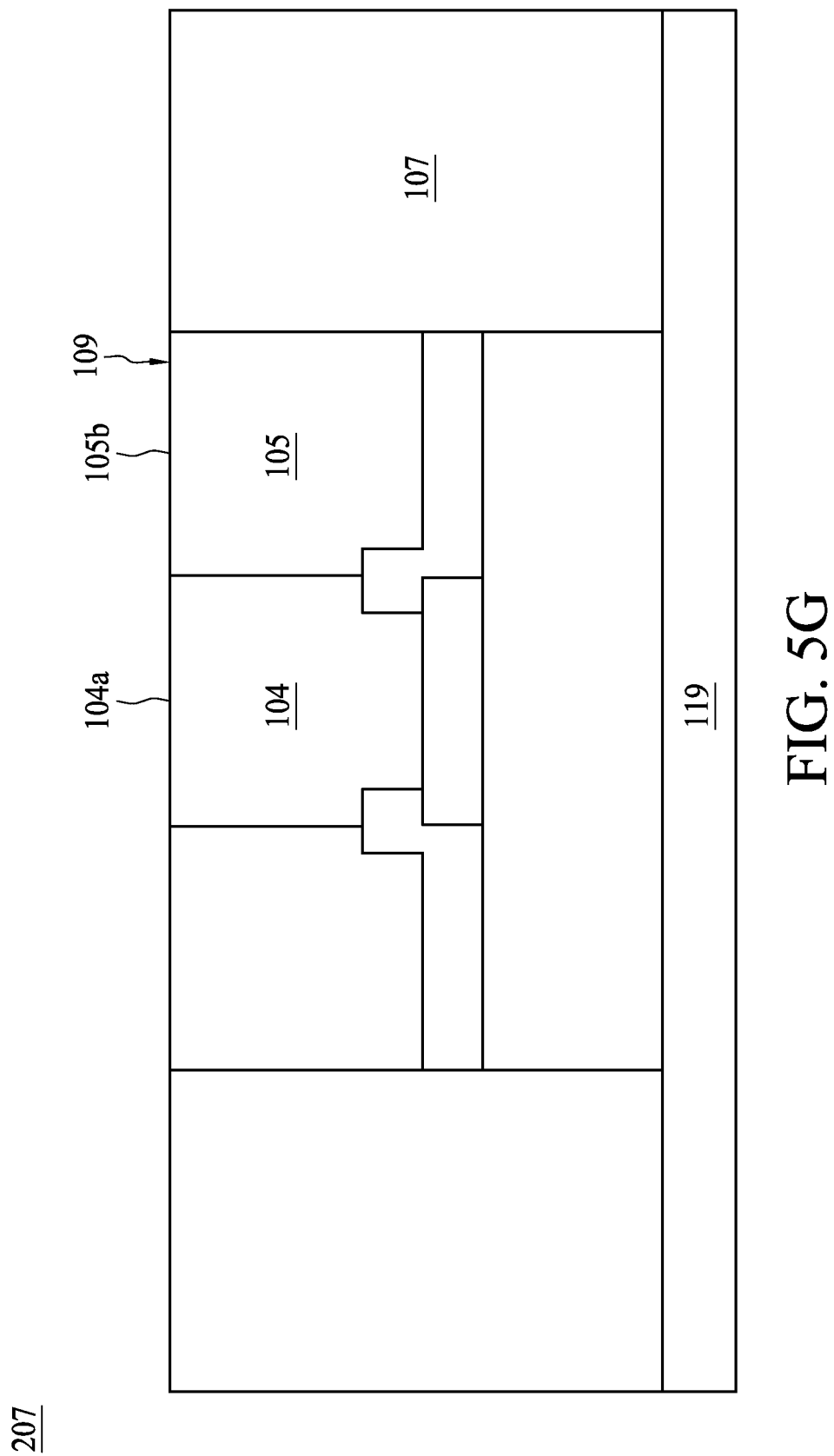

In operation 207, the die 109 singulated from the semiconductor substrate 102 is placed on a carrier 119. A molding 107 is formed on the carrier 119 to surround the die 109. A removal or planarization operation is introduced to remove a portion of the molding 107 in order to expose the top surface 104a of the conductor 104 and a top surface 105b of the dielectric 105, such that there is no molding 107 remaining on the conductor 104 and the polymeric material. FIG. 5G is an embodiment showing the structure after the removal operation. In some embodiments, the top portion of the molding 107, the conductor 104, and the dielectric 105 are concurrently removed by an operation such as etching or grinding in order to be coplanar. In some embodiments, there are through vias (not shown) formed in the molding 107 and adjacent to the die 109.

Figure 5H:
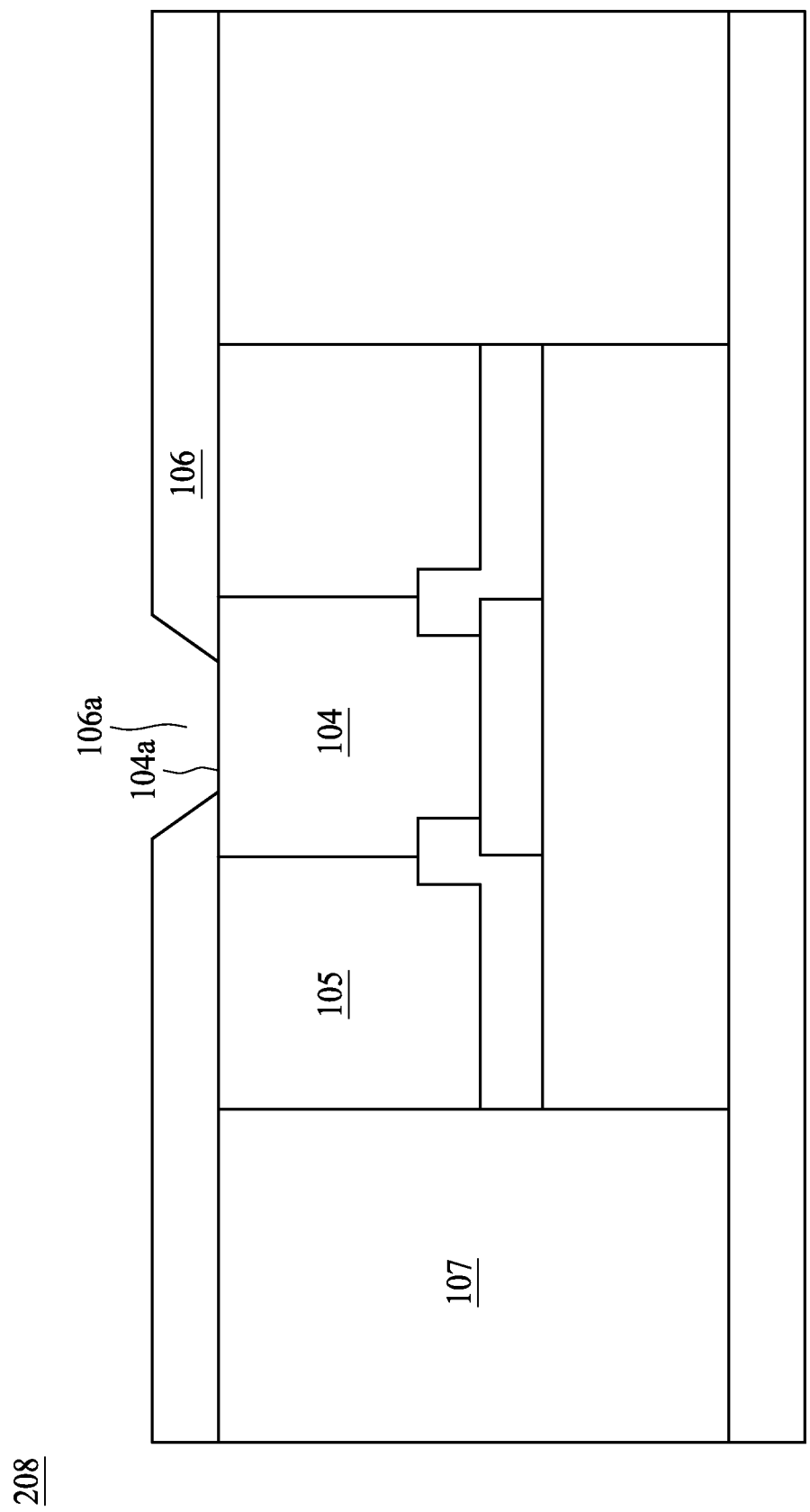

In operation 208, a dielectric 106 is disposed over molding 107, the conductor 104 and the dielectric 105 as in FIG. 5H. In some embodiments, the dielectric 106 includes a polymeric material such as epoxy, polyimide, polybenzoxazole (PB 0), solder resist (SR), ABF film, and the like. In some embodiments, a recessed portion 106a is formed above the top surface 104a of the conductor 104 as in FIG. 5H. In some embodiments, some of the dielectric 106 above the top surface 104a are removed by etching.

Figure 5I:
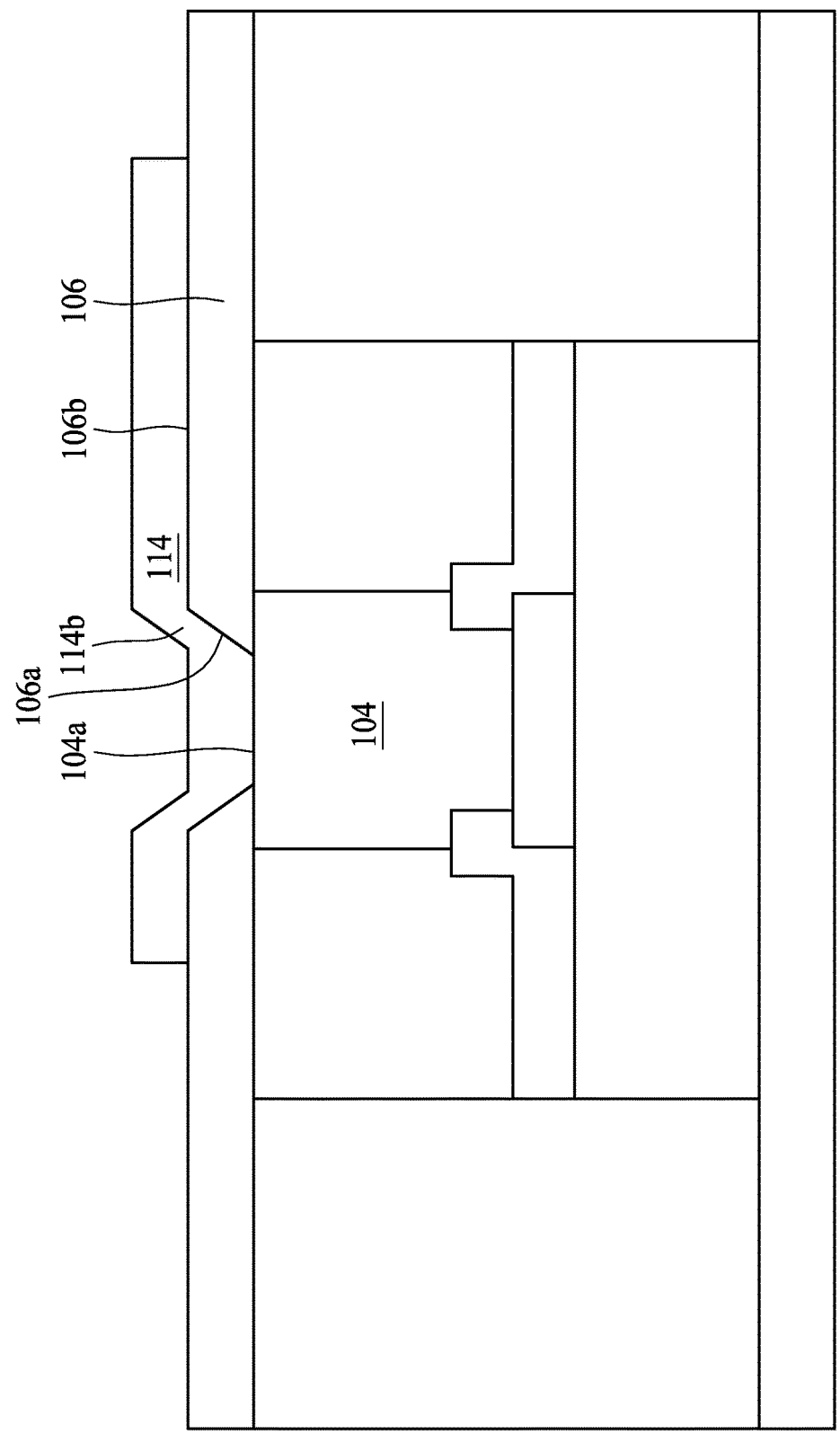

In operation 209, a first redistribution layer (RDL) 114 is disposed as in FIG. 5I. In some embodiments, the RDL 114 is disposed on the dielectric 106 by electroplating or sputtering. In some embodiments, the RDL 114 includes a section 114b extending from the top surface 106b of the dielectric 106 to the top surface 104a of the conductor 104. The section 114b is disposed along the recessed portion 106a. The RDL 114 is electrically connected with the conductor 104 through the top surface 104a and the extended portion 114b.

Figure 5J:
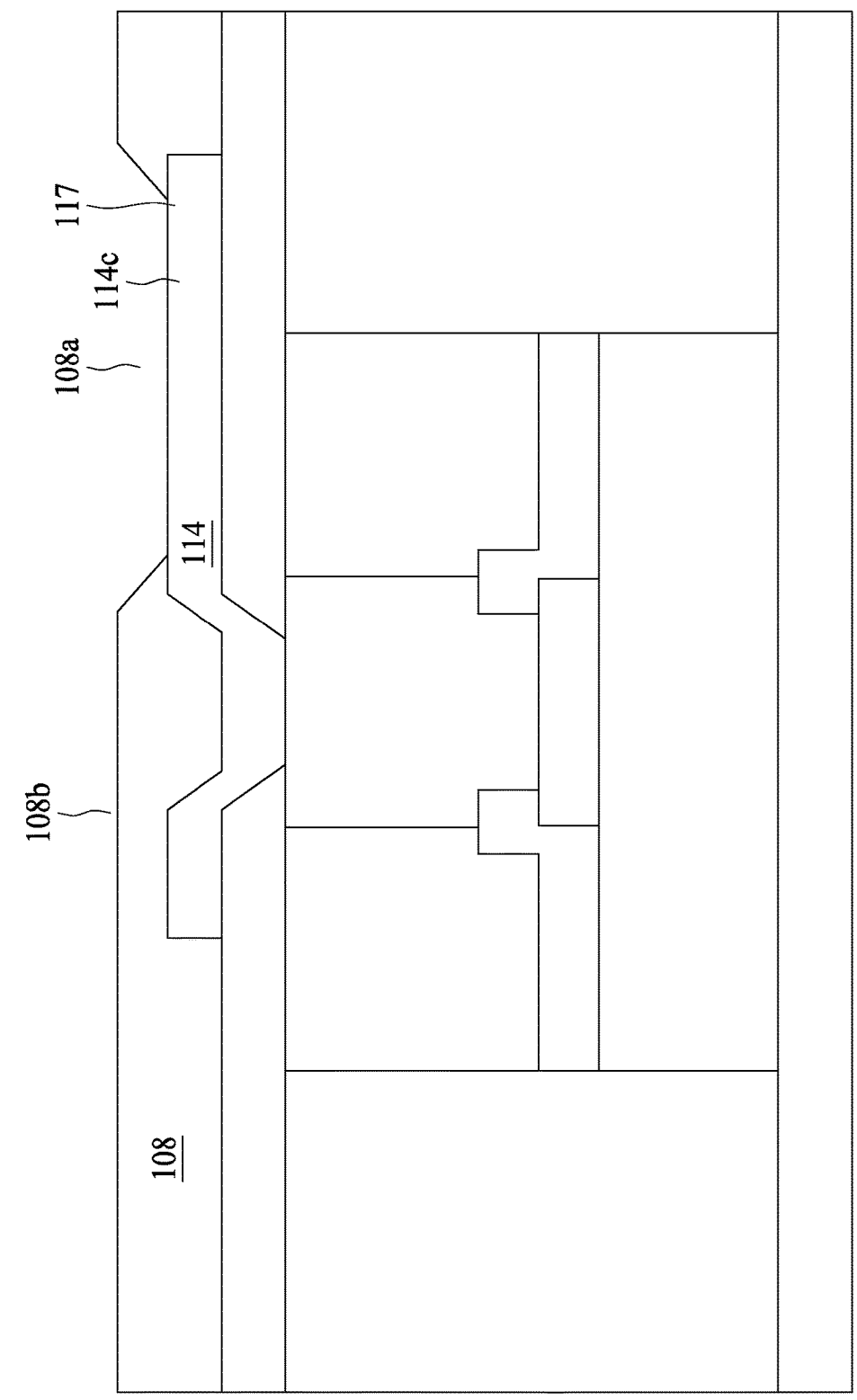

In operation 210, a dielectric 108 is disposed and an opening 108a is formed as in FIG. 5J. In some embodiments, the dielectric 108 is disposed on the RDL 114. The dielectric 108 covers the top of the semiconductor device 100. In some embodiments, the dielectric 108 includes a polymeric material such as epoxy, polyimide, polybenzoxazole (PBO), solder resist (SR), ABF film, and the like.

In some embodiments, the opening 108a is formed by removing some of the dielectric 108 above the RDL 114. In some embodiments, some of the dielectric 108 is removed by etching to form the opening 108a. In some embodiments, the opening 108a is in a tapered configuration. In some embodiments, the opening 108a is extended from atop surface 108c of the dielectric 108 to a section 114c of the RDL 114.

Figure 5K:
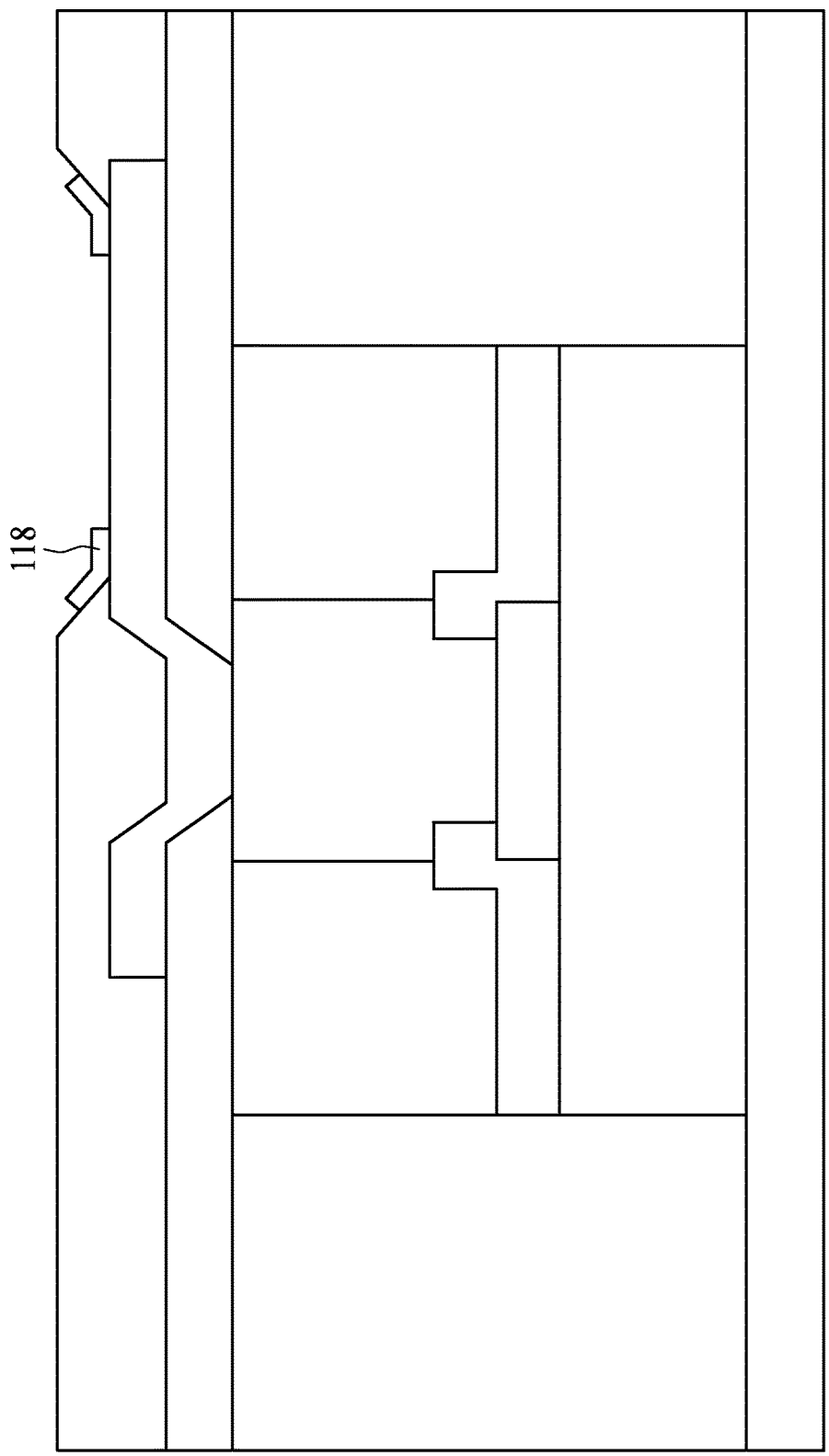

In operation 211, a barrier 118 is disposed as in FIG. 5K. The barrier 118 is disposed on a joint, which is a point or line where the dielectric 108 meets the RDL 114. In some embodiments, the joint is like point 117 in FIG. 5J and the joint may be exposed to the opening 108a if without the protection of the barrier 118. The barrier 118 covers the joint 117 to isolate the joint 117 from the ambient in opening 108a.

In some embodiments, the barrier 118 is formed by firstly disposing a layer over the dielectric 108 and the RDL 114, and then patterning to remove a portion of the layer to have only enough coverage on the joint 117. The initial stage of the barrier formation may be through a deposition process, such as sputtering, or CVD (Chemical Vapor Deposition) to form a continuous film covering the dielectric 108 and the RDL 114. A patterning operation including photolithography or etch is used to remove excessive portion and only leave the barrier 118 proximal to the RDL 114 to cover the joint. In some embodiments, the barrier 118 is substantially thinner than the dielectric 108 and the RDL 114 and is further extended to be proximal to the joint 117 between the dielectric 108 and the RDL 114.

Figure 5L:
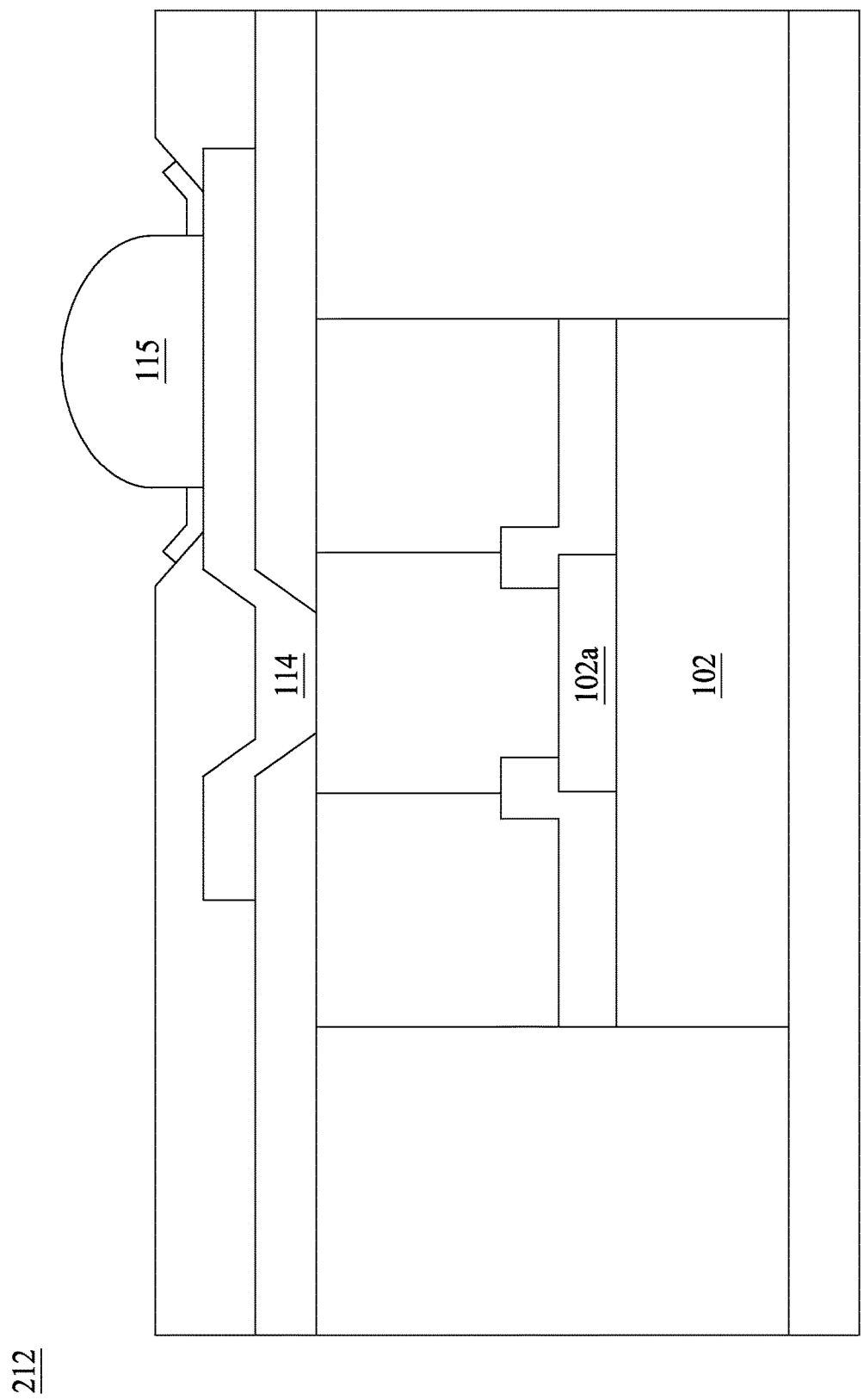

In operation 212, a bump 115 is disposed on the RDL 114 as in FIG. 5L. In some embodiments, the bump 115 is a solder bump, solder ball, solder paste or etc. In some embodiments, the bump 115 is configured for attaching with a pad on another die, another substrate or another semiconductor package. In some embodiments, the bump 115 is a conductive bump or a conductive joint. In some embodiments, the conductive pad 102a is electrically connected with the bump 115 through the conductor 104 and the RDL 114. In some embodiments, the bump formation operation further includes applying an oxide remover on the RDL 114 before disposing the bump.

For some embodiment, operation 213 is further introduced wherein the carrier 119 is removed from the semiconductor device 100 as in FIG. 5K. The structure shown in FIG. 5J is flipped upside down and attached to another substrate 120 at the bottom of FIG. 5M. The substrate 120 may be a package substrate, board (e.g., a printed circuit board (PCB)), a wafer, a die, an interposer substrate, or other suitable substrate. The bump structure is coupled to the substrate 120 through various conductive attachment points. For example, a conductive region 122 is formed and patterned on the substrate 120. The conductive region 122 is a contact pad or a portion of a conductive trace, which is presented by a mask layer 124. In one embodiment, the mask layer 124 is a solder resist layer formed and patterned on the substrate 120 to expose the conductive region 122. The mask layer 124 has a mask opening, which provides a window for solder joint formation. For example, a solder layer including alloys of tin, lead, silver, copper, nickel, bismuth, or combinations thereof may be provided on the conductive region 122. The semiconductor device 100 can be coupled to the substrate 120 through a joint solder structure 126 between the RDL 114 and the conductive region 122. An exemplary coupling process includes a flux application, chip placement, reflowing of melting solder joints, and/or cleaning of flux residue. The semiconductor substrate 102, the joint solder structure 126, and the other substrate 120 may be referred to as a packaging assembly, or in the present embodiment, a flip-chip packaging assembly.

FIG. 6A-FIG. 6G includes operations of a method of manufacturing a semiconductor device 300. The method includes a number of operations (401, 402, 403, 404, 405, 406, and 407). The method includes operations similar to the method in FIG. 5-FIG. 5M such that details of the elements indicated with the same numerical labels are not repeated herein.

Figure 6A:
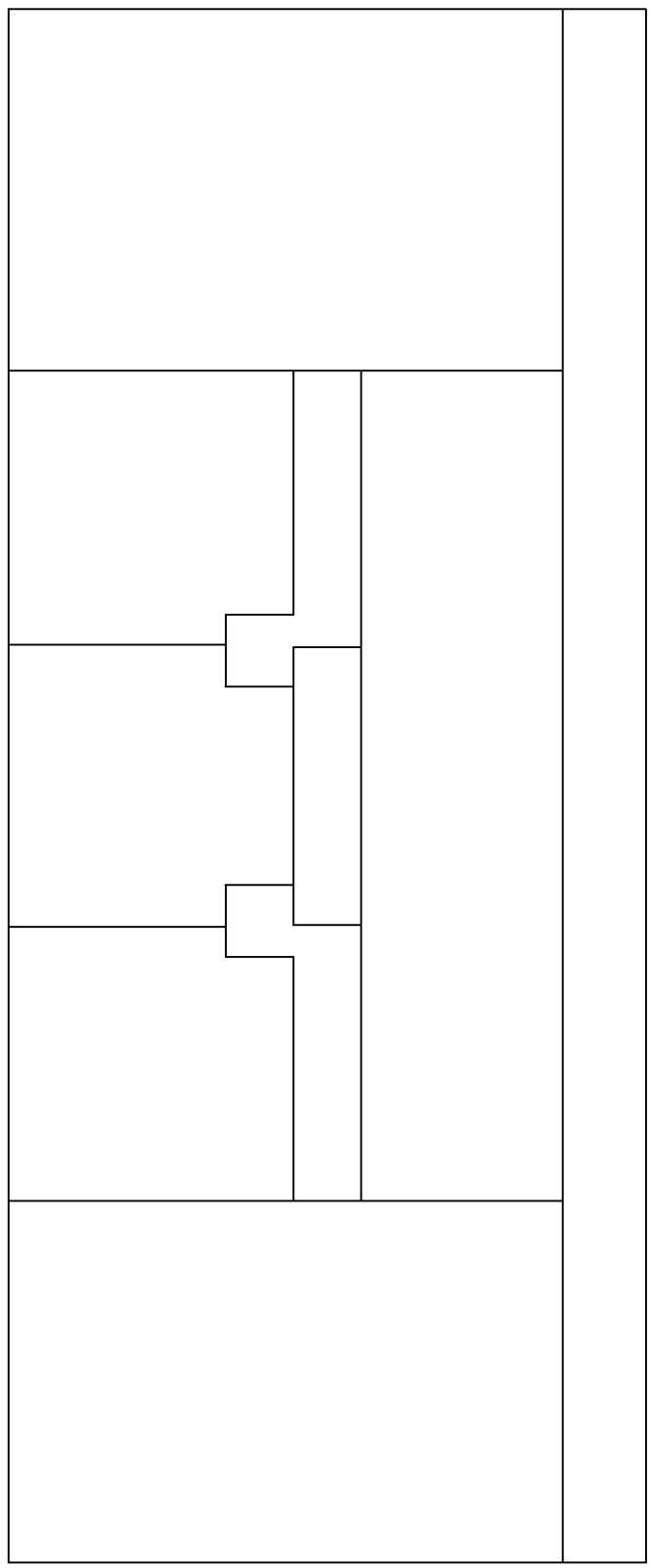
FIG. 6A-FIG. 6G are operations of a method of manufacturing a semiconductor device in accordance with some embodiments.
Figure 6B:
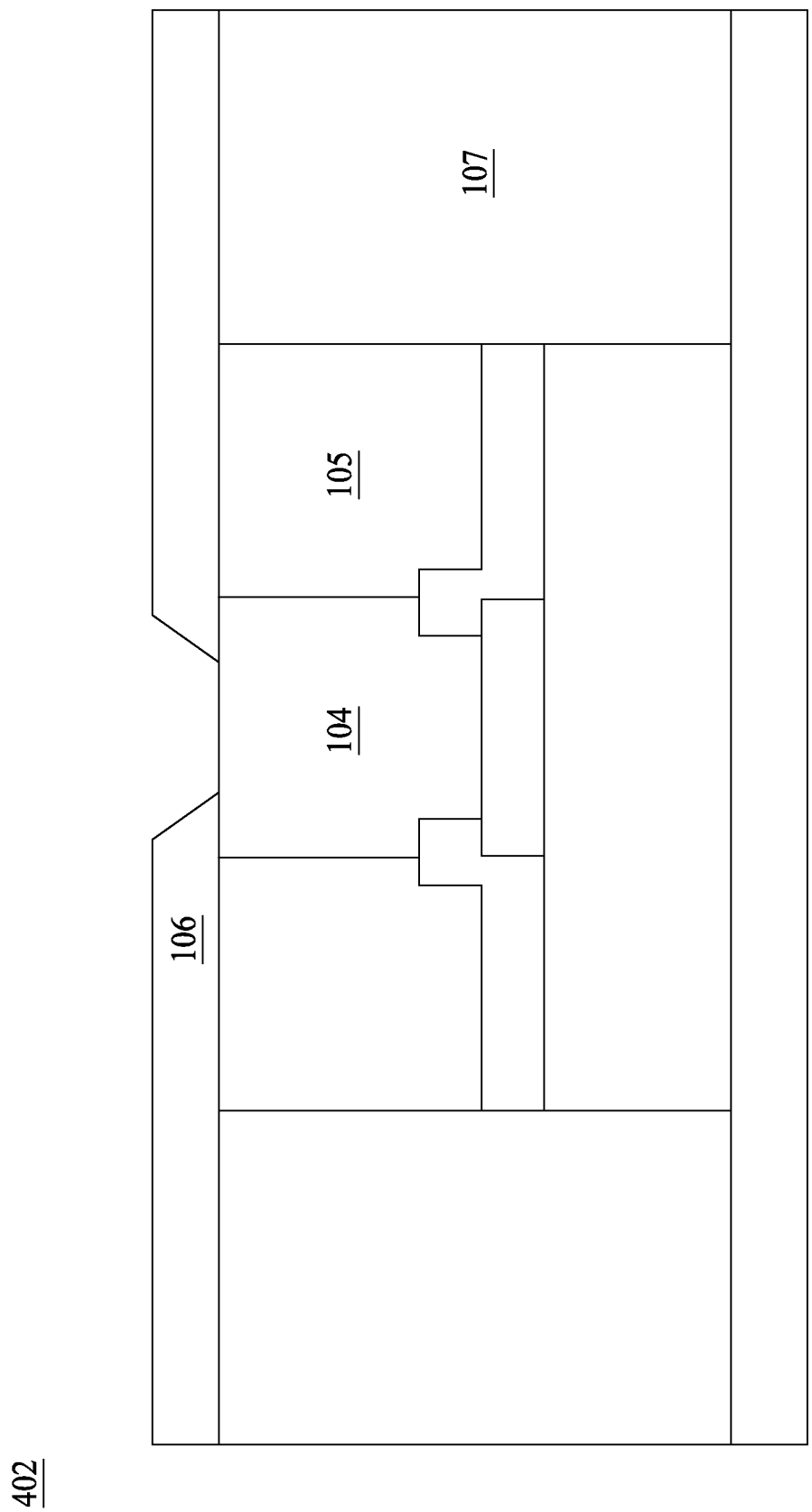
Figure 6C:
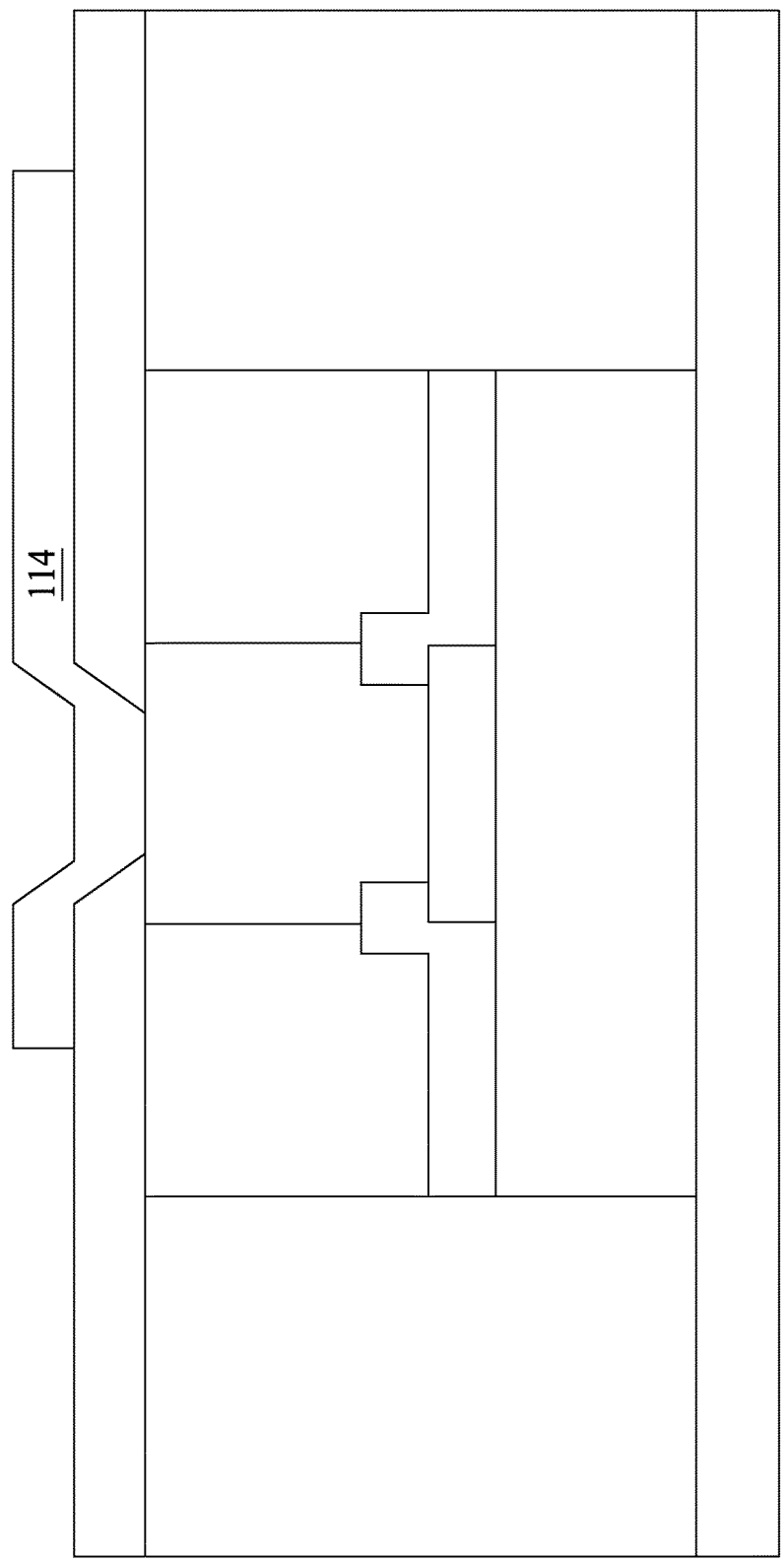
Figure 6D:
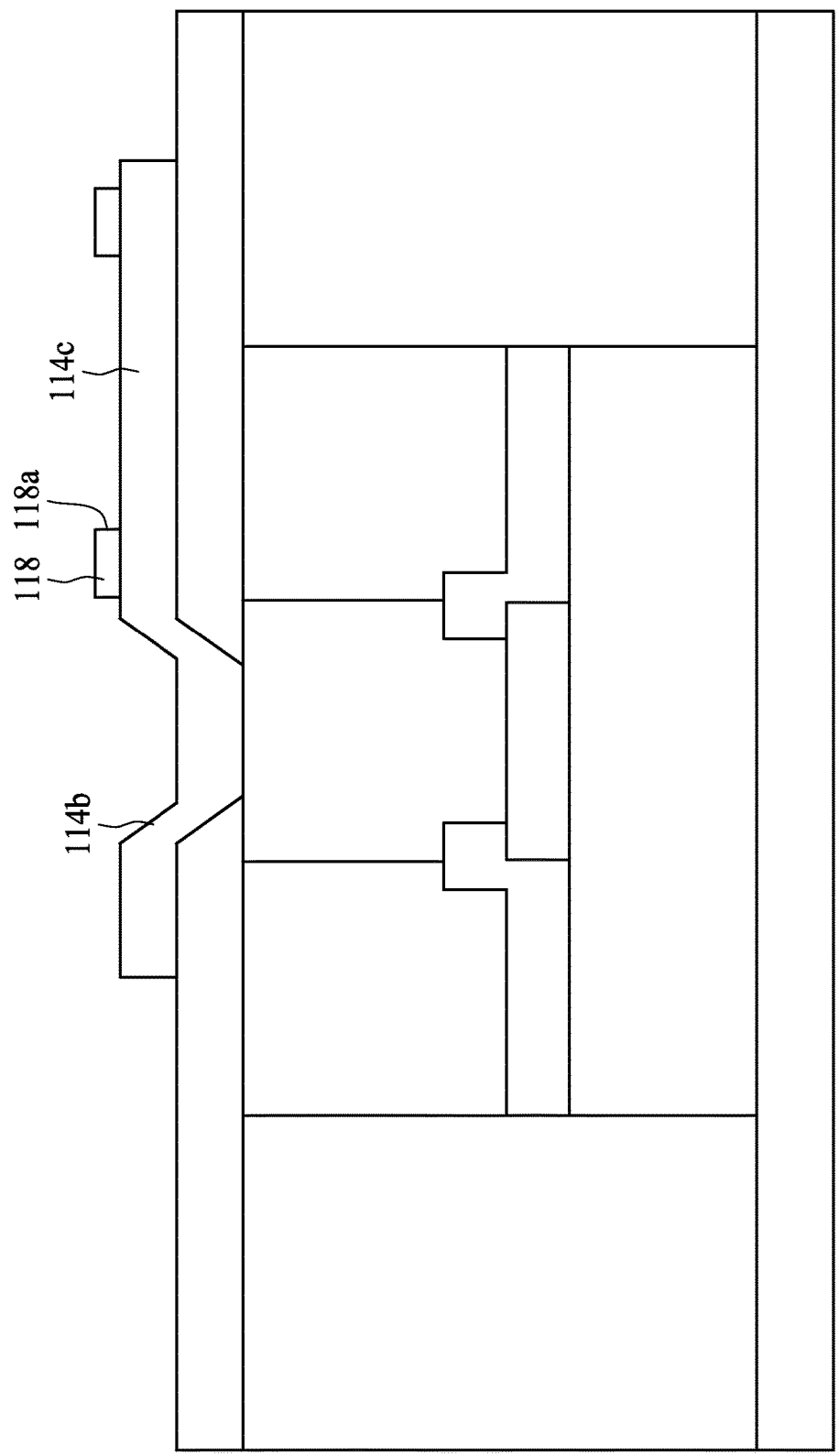
Figure 6E:
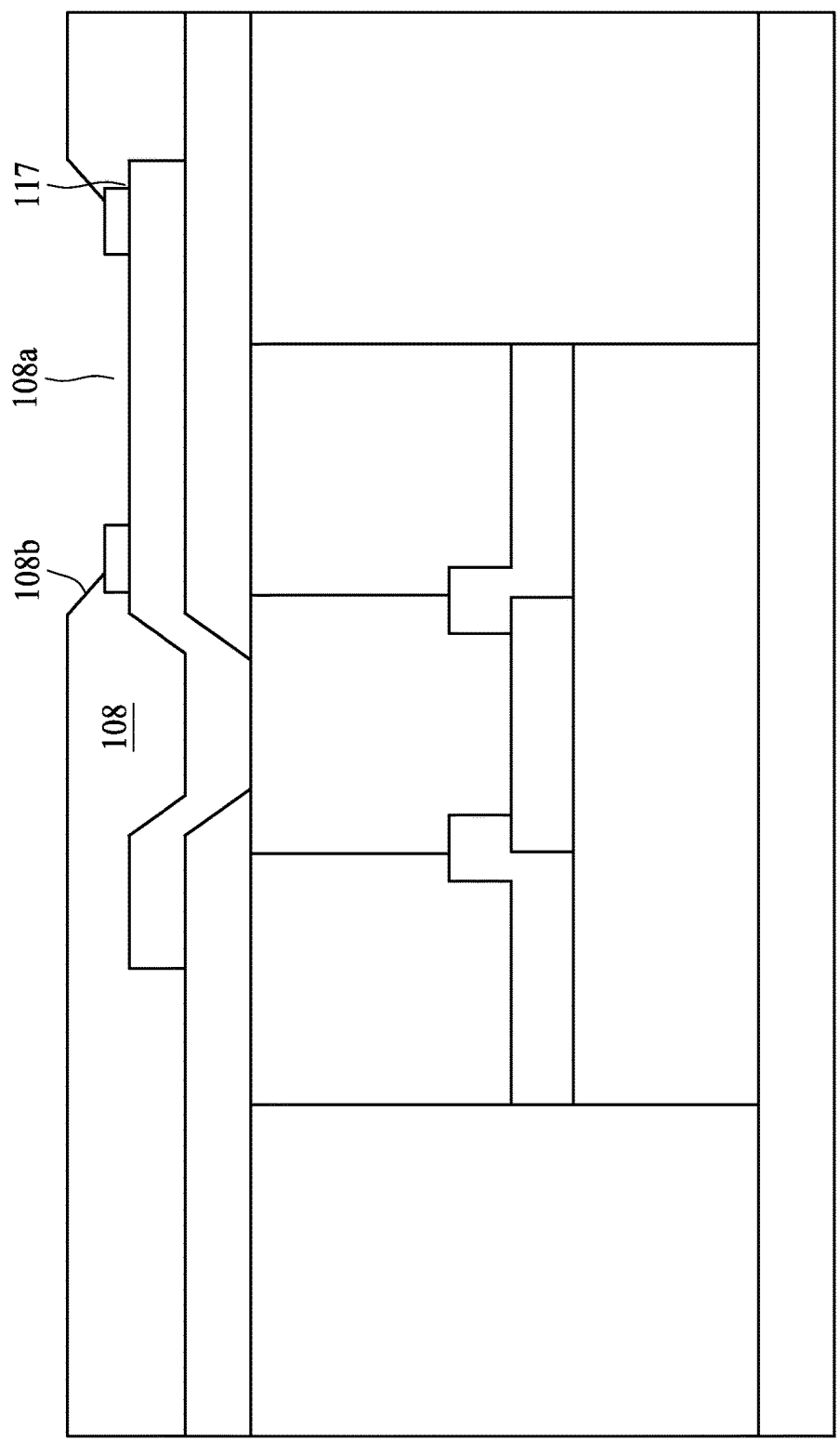

In operation 401, an embodiment in FIG. 6A shows a structure after the removal operation as shown in FIG. 5G. In operation 402, a dielectric 106 is disposed over molding 107, the conductor 104 and the dielectric 105 as in FIG. 6B. In operation 403, a first RDL 114 is disposed as in FIG. 6C. In operation 404, a barrier 118 is disposed as in FIG. 6D. In some embodiments, the barrier 118 is formed by firstly disposing a layer over the RDL 114, and then patterning to remove a portion of the layer to have several predetermined sections remained on the RDL 114. The initial stage of the barrier formation may be through a deposition process, such as sputtering, or CVD (Chemical Vapor Deposition) to form a continuous film covering the RDL 114. A patterning operation including photolithography or etch is used to remove excessive portion and only leave the barrier 118 on the RDL 114.

In operation 405, a dielectric 108 is disposed over the barrier 118 and the RDL 114. An opening 108a is formed as in FIG. 6E to expose a portion of the RDL 114 and the barrier 118. The portion of the barrier 118 under the dielectric 108 is sandwiched by the dielectric 108 and the RDL 114 such that the joint 117 is isolated from the ambient in the opening 108a. In other words, the aforementioned predetermined sections of the barrier 118 laid on the RDL 114 are located proximal to the positions where the opening 108a is to be formed.

Figure 6F:
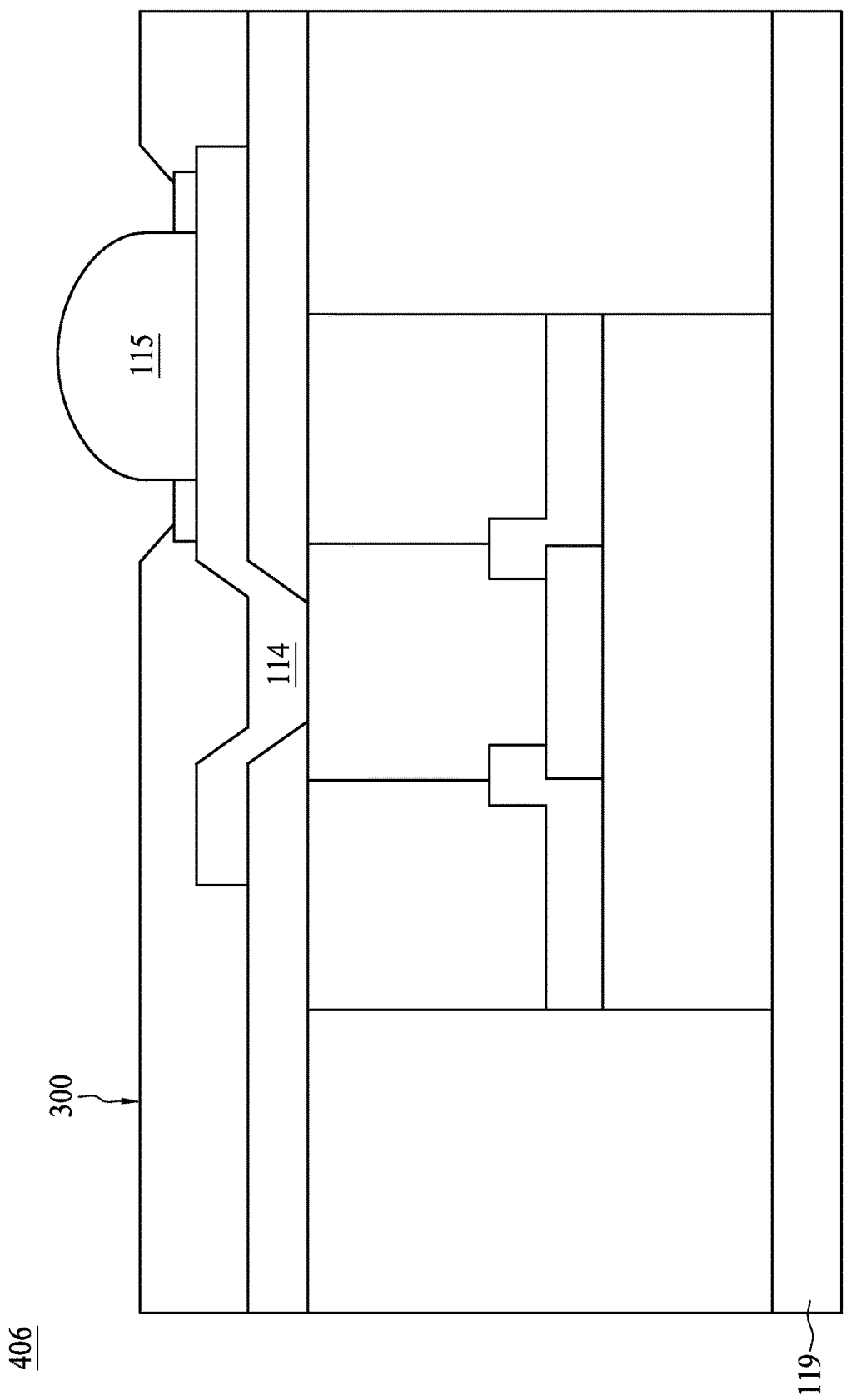
Figure 6G:
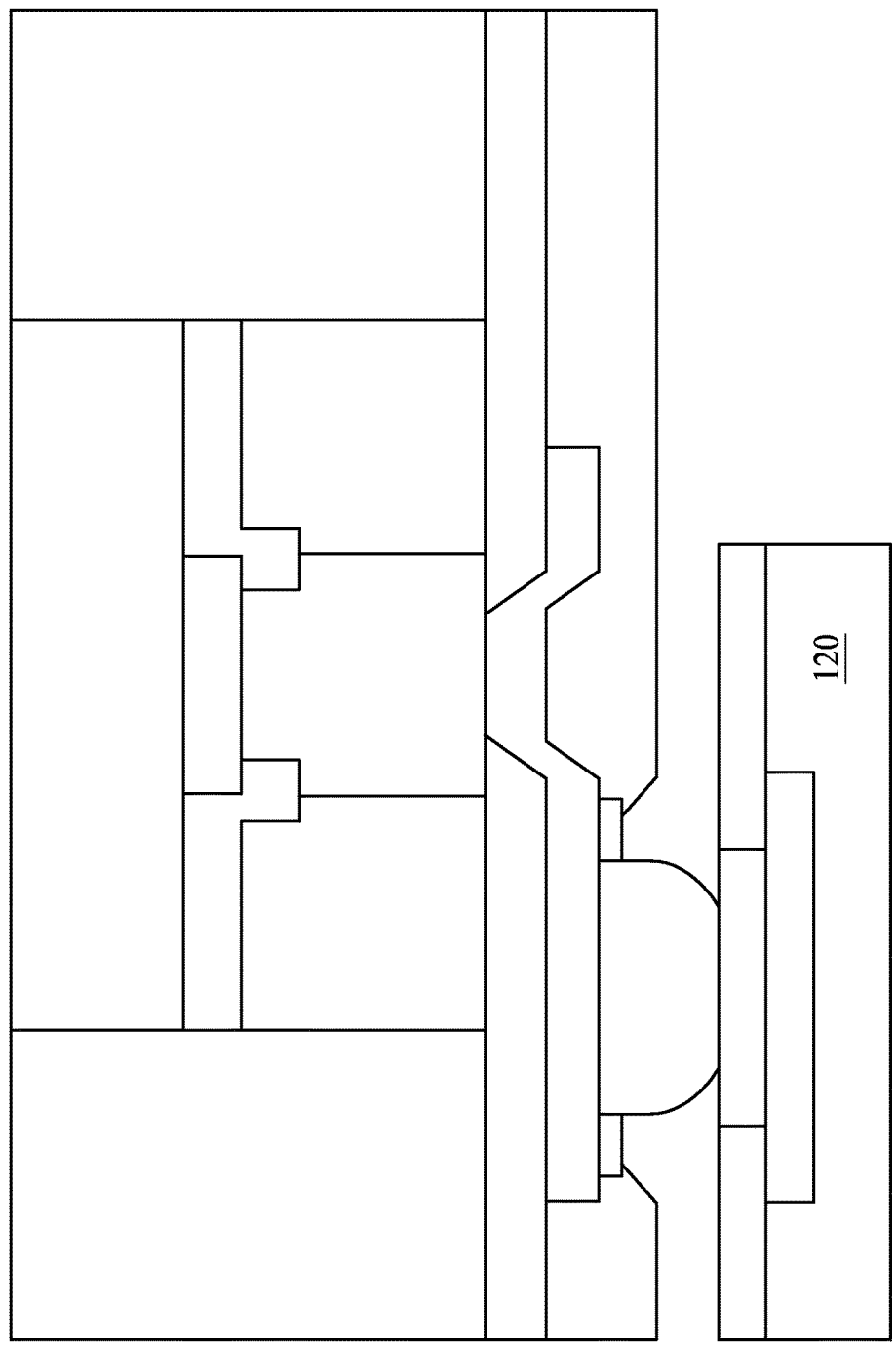

In operation 406, a bump 115 is disposed on the RDL 114 as in FIG. 6F. In operation 407, the carrier 119 is removed from the semiconductor device 300 as in FIG. 6G, and the structure shown in FIG. 6F is flipped upside down and attached to another substrate 120 at the bottom of FIG. 6G. In some embodiments, prior to the operation 407, an RDL (not shown) is disposed on a backside of the semiconductor device 300. The backside of the semiconductor device 300 is defined as the side opposite to the bump 115. In some embodiments, the semiconductor substrate 102 is bonded to another package substrate (not shown) on the backside of the semiconductor device 300.

FIG. 7A-FIG. 7F further illustrate several detailed operations of a method of disposing a barrier in the semiconductor device 100. The method includes a number of operations (601, 602, 603, 604, 605, and 606). The method includes operations similar to the method in FIG. 5-FIG. 5M such that details of the elements indicated with the same numerical labels are not repeated herein.

Figure 7A:
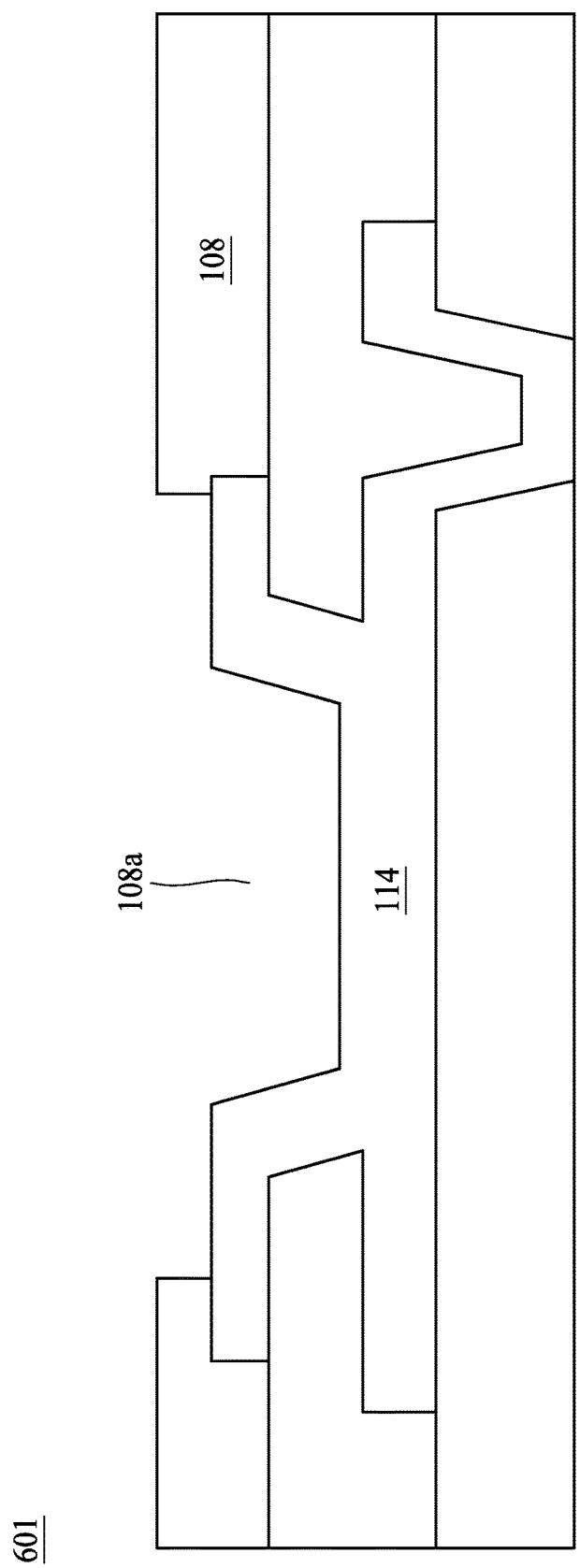
FIG. 7A-FIG. 7F are operations of a method of disposing a barrier in accordance with some embodiments.
Figure 7B:
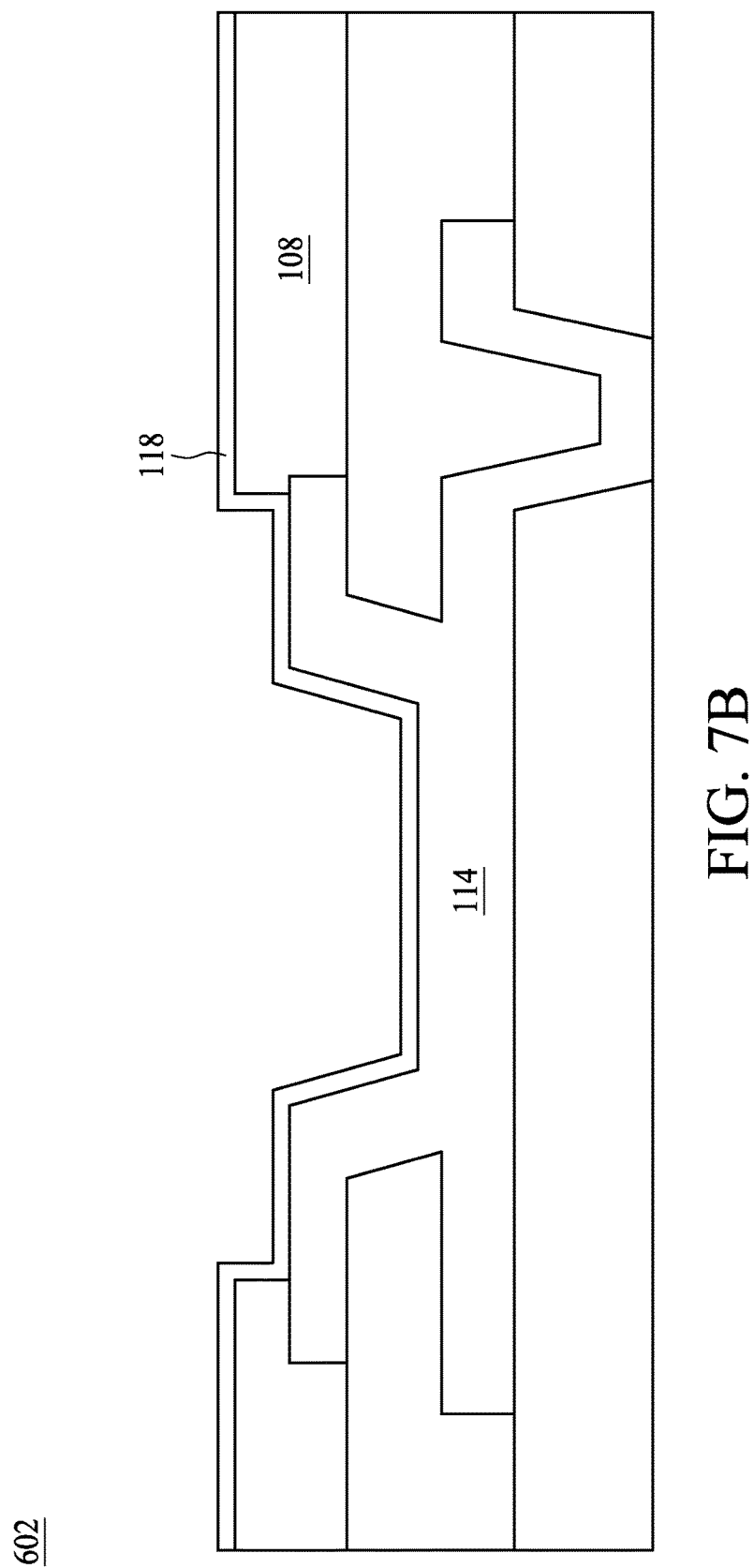
Figure 7C:
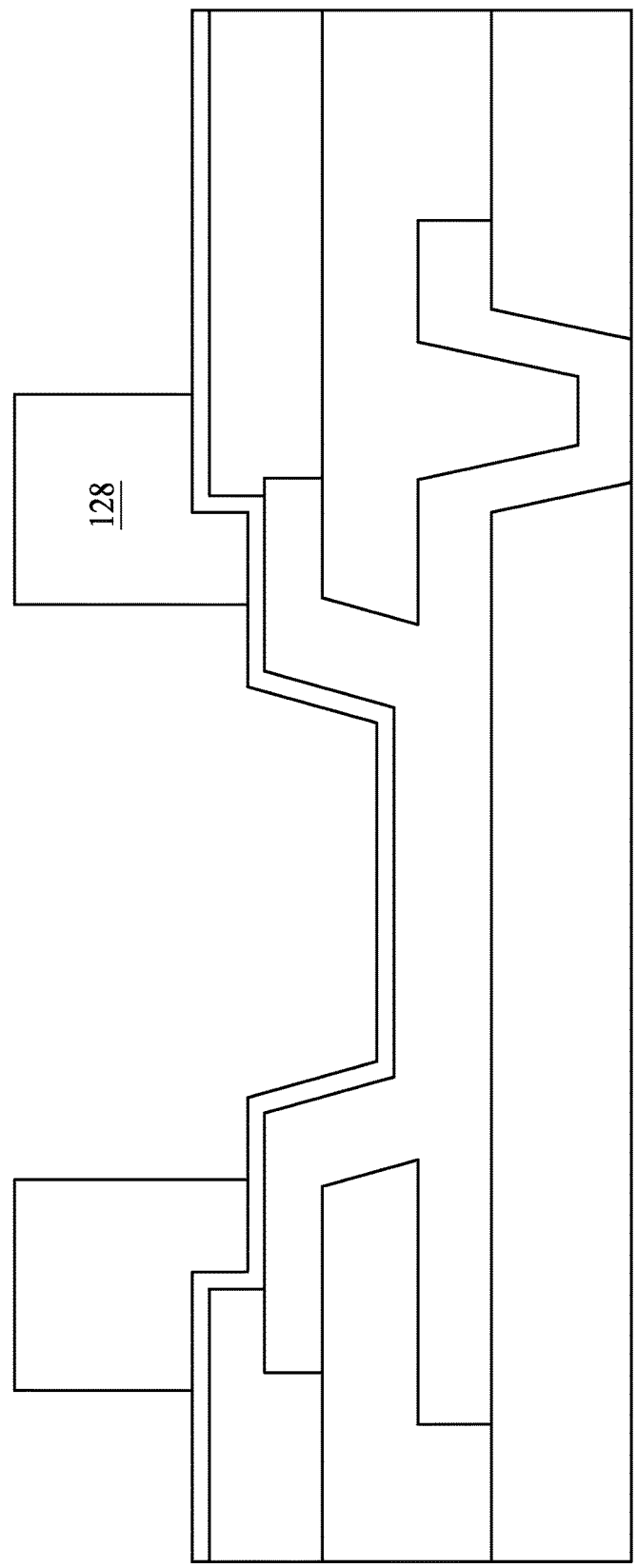
Figure 7D:
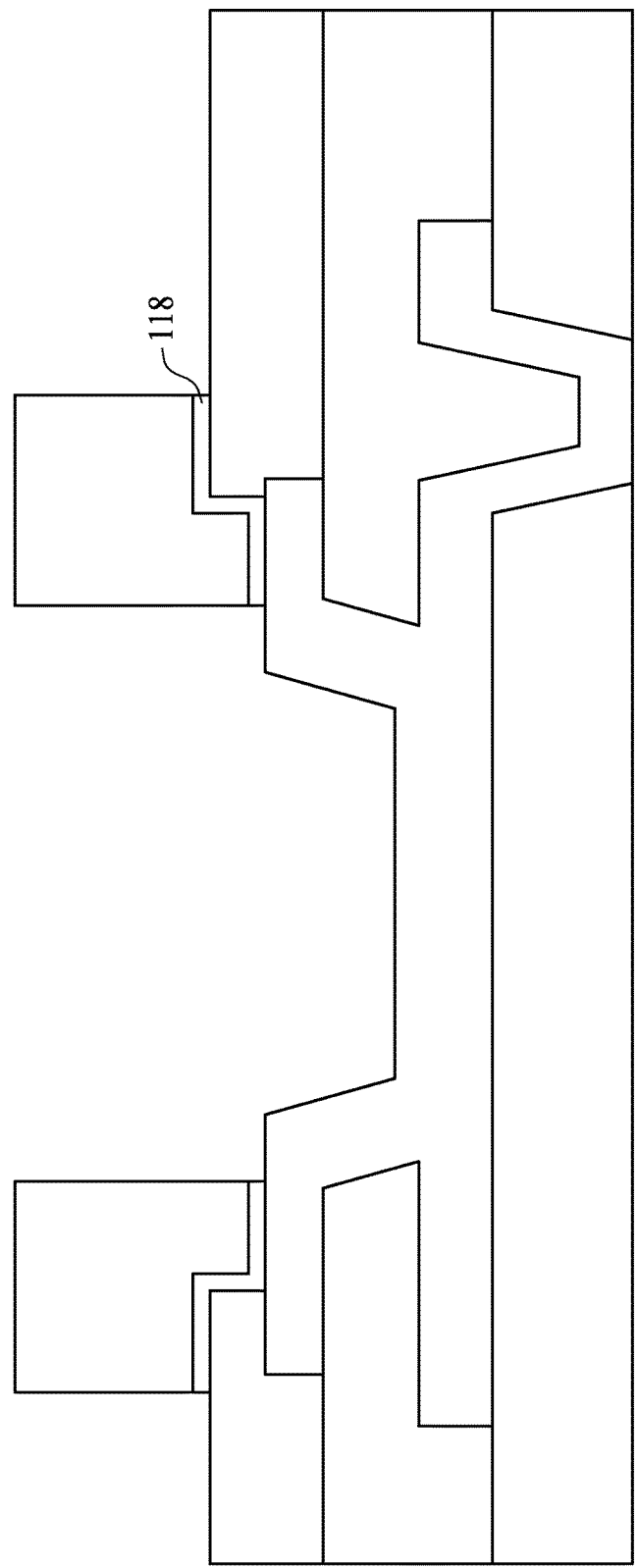
Figure 7E:
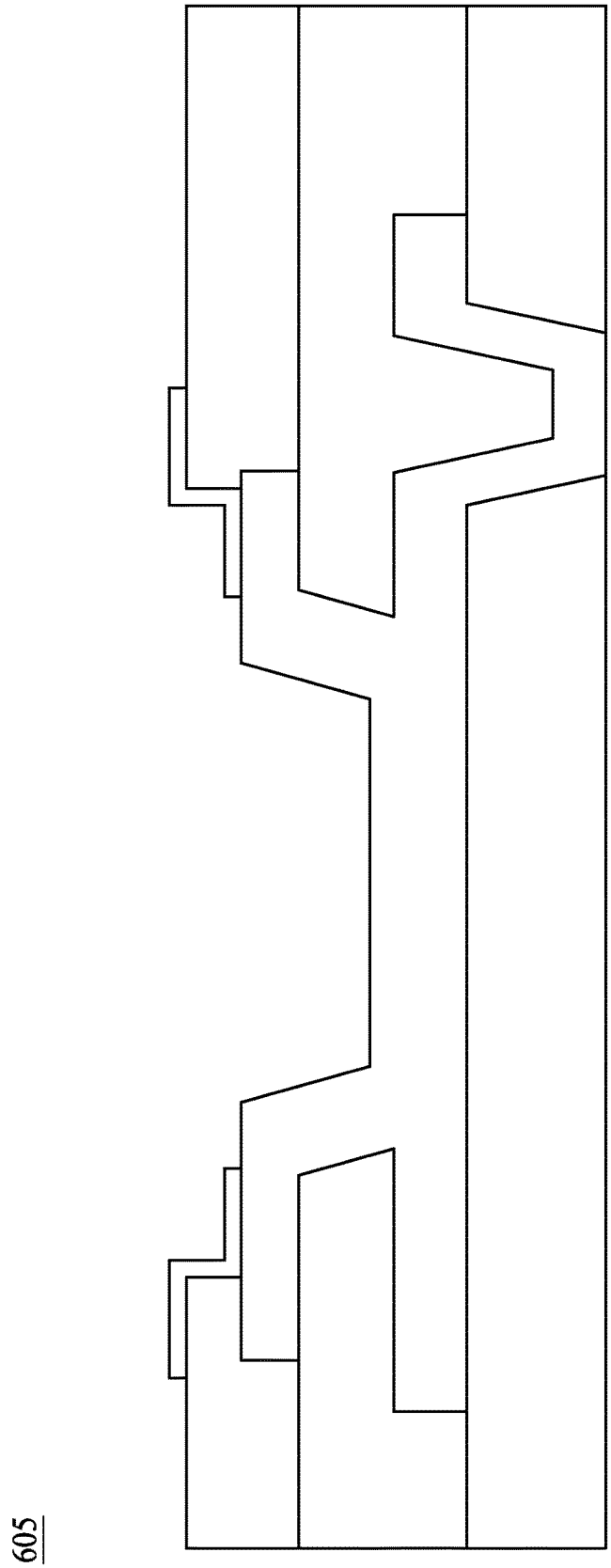
Figure 7F:
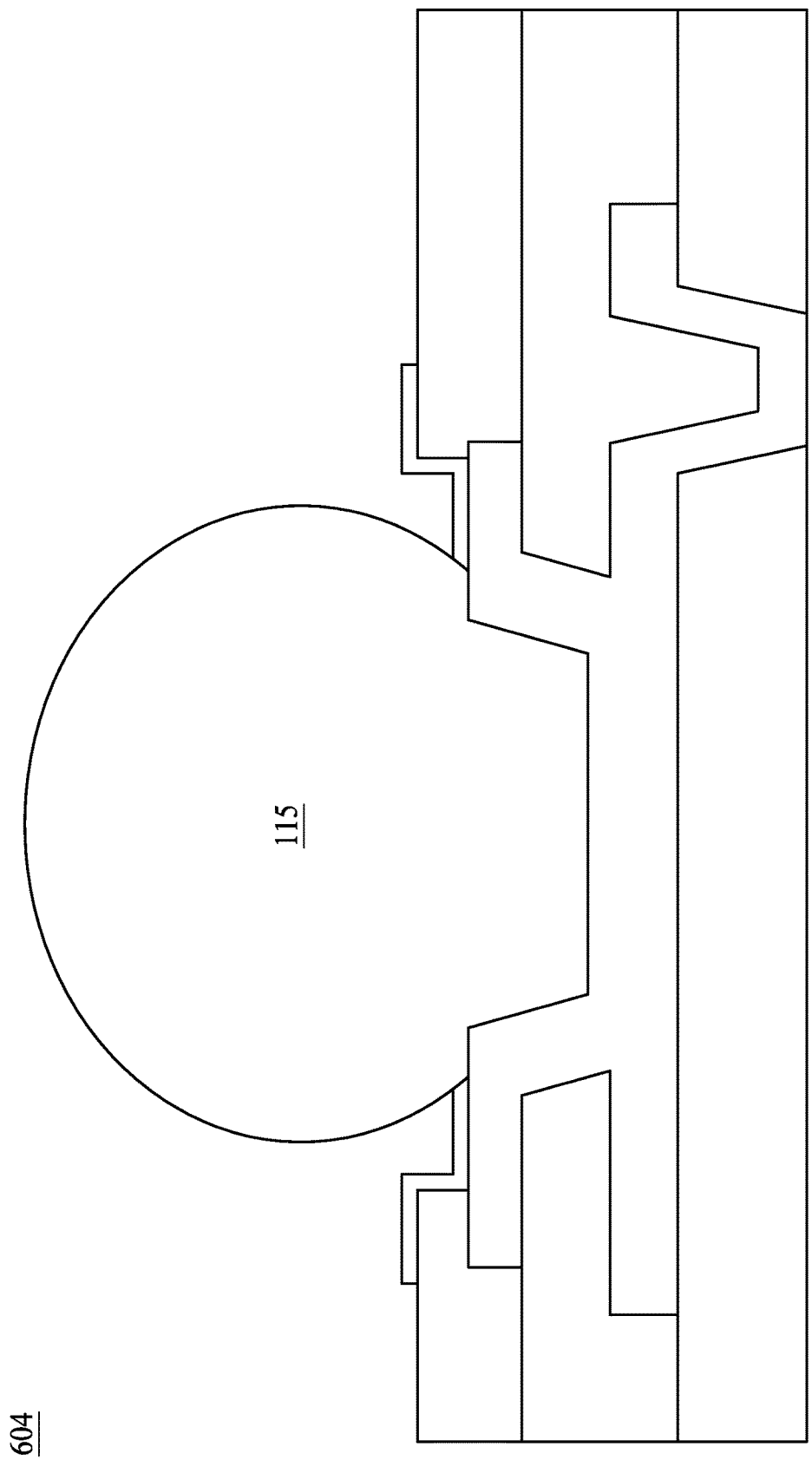

In operation 601, the dielectric 108 is disposed and an opening 108a is formed as in FIG. 7A. In operation 602, a barrier 118 is disposed on the dielectric 108 and the RDL 114 as in FIG. 7B. In operation 603, a photoresist 128 is disposed on the barrier 118 as in FIG. 7C. In some embodiments, a photomask with a predetermined pattern is provided. In operation 604, some portions of barrier 118 are removed to form a ring-like shape barrier 118 as in FIG. 7D. In operation 605, the photoresist 128 (refers to FIG. 7D) is removed as in FIG. 7E. In operation 606, a bump 115 is disposed on the RDL 114 as in FIG. 7F.

FIG. 8A-FIG. 8G further illustrate several detailed operations of a method of disposing a barrier in a semiconductor device 300. The method includes a number of operations (801, 802, 803, 804, 805, 806, and 807). The method includes operations similar to the method in FIG. 6-FIG. 6G such that details of the elements indicated with the same numerical labels are not repeated herein.

Figure 8A:
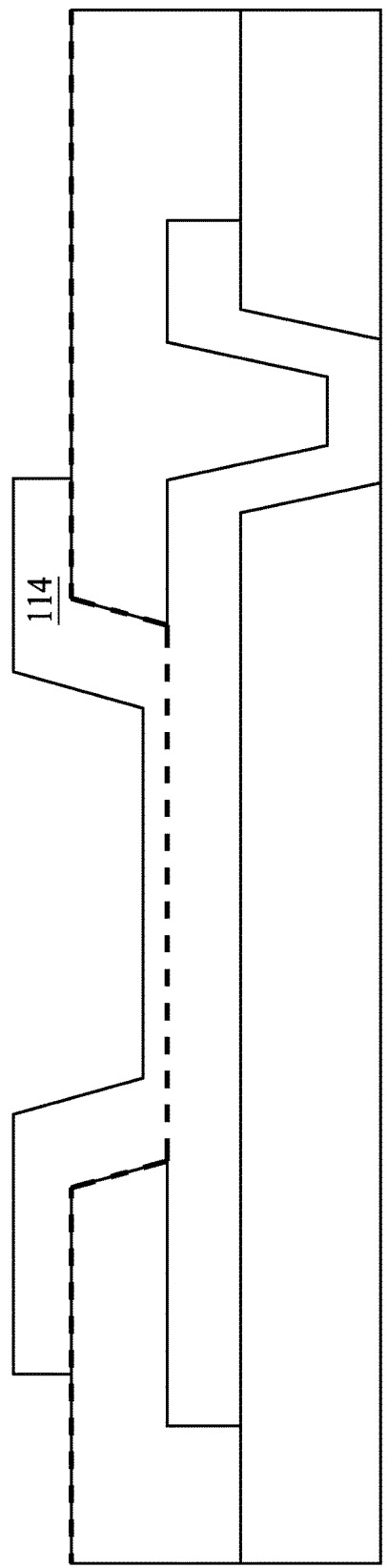
FIG. 8A-FIG. 8G are operations of a method of disposing a barrier in accordance with some embodiments.
Figure 8B:
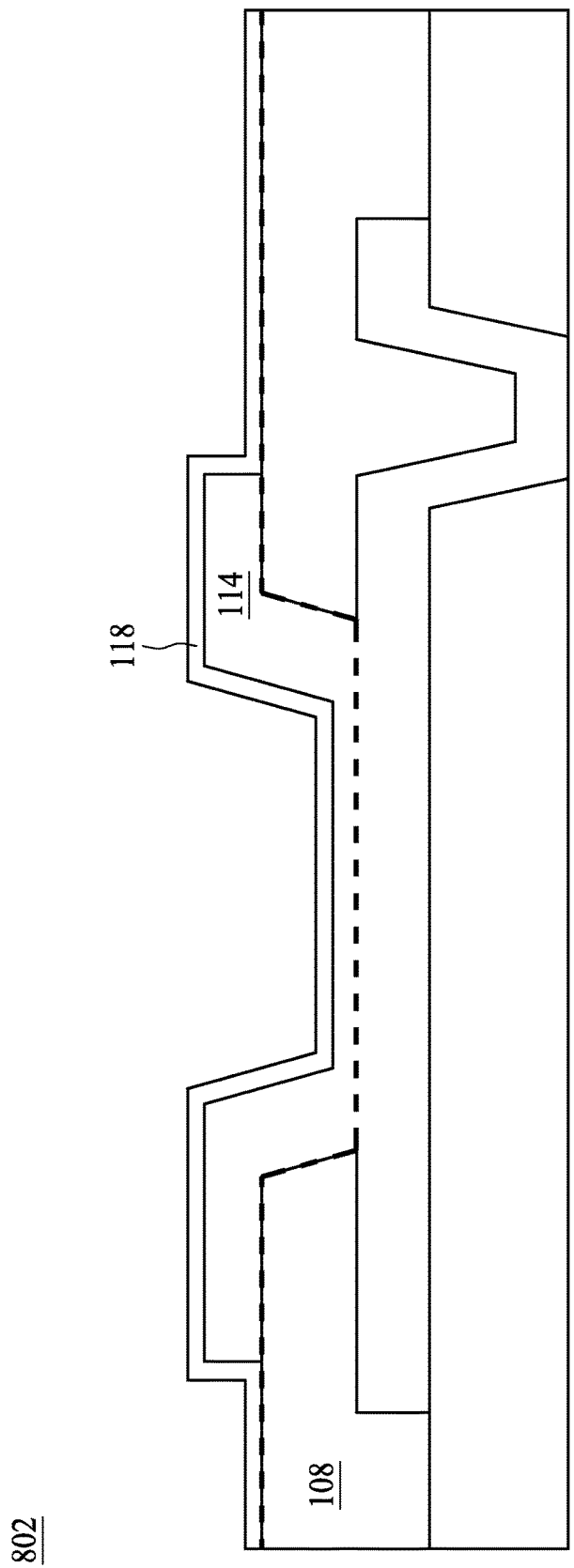
Figure 8C:
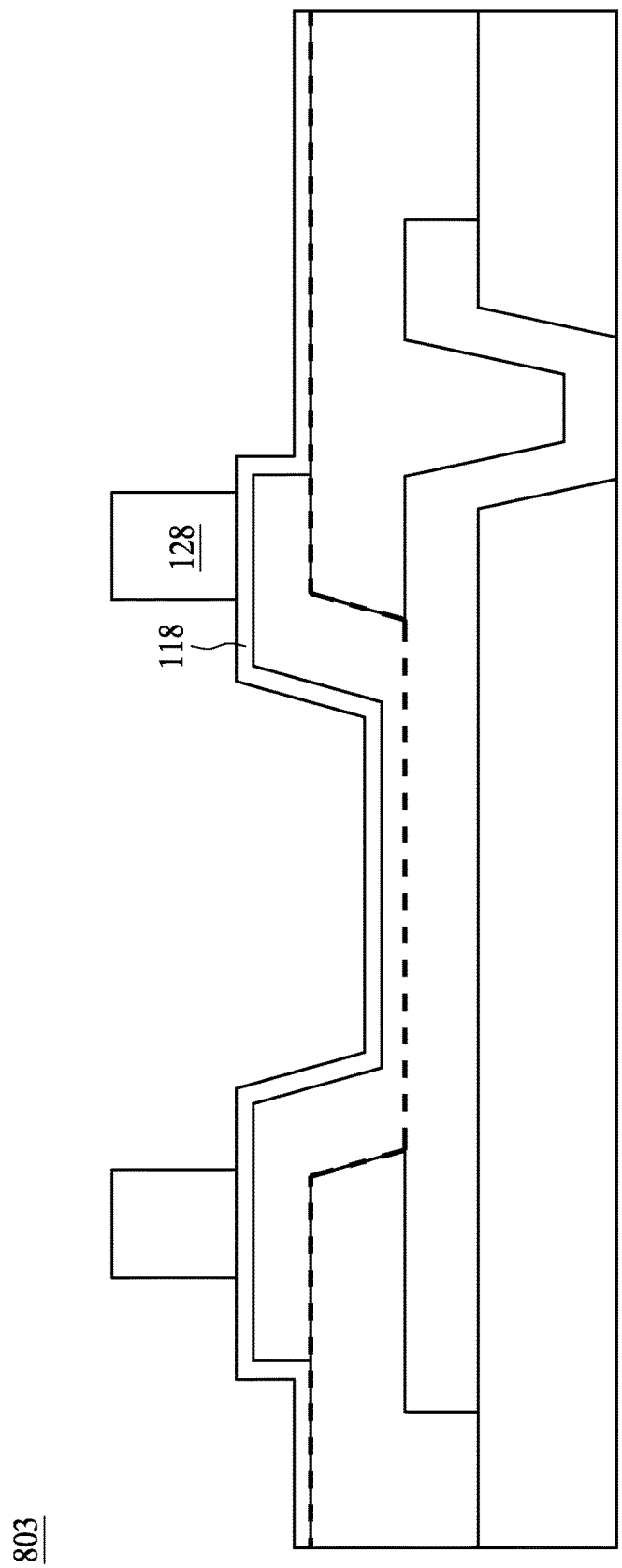
Figure 8D:
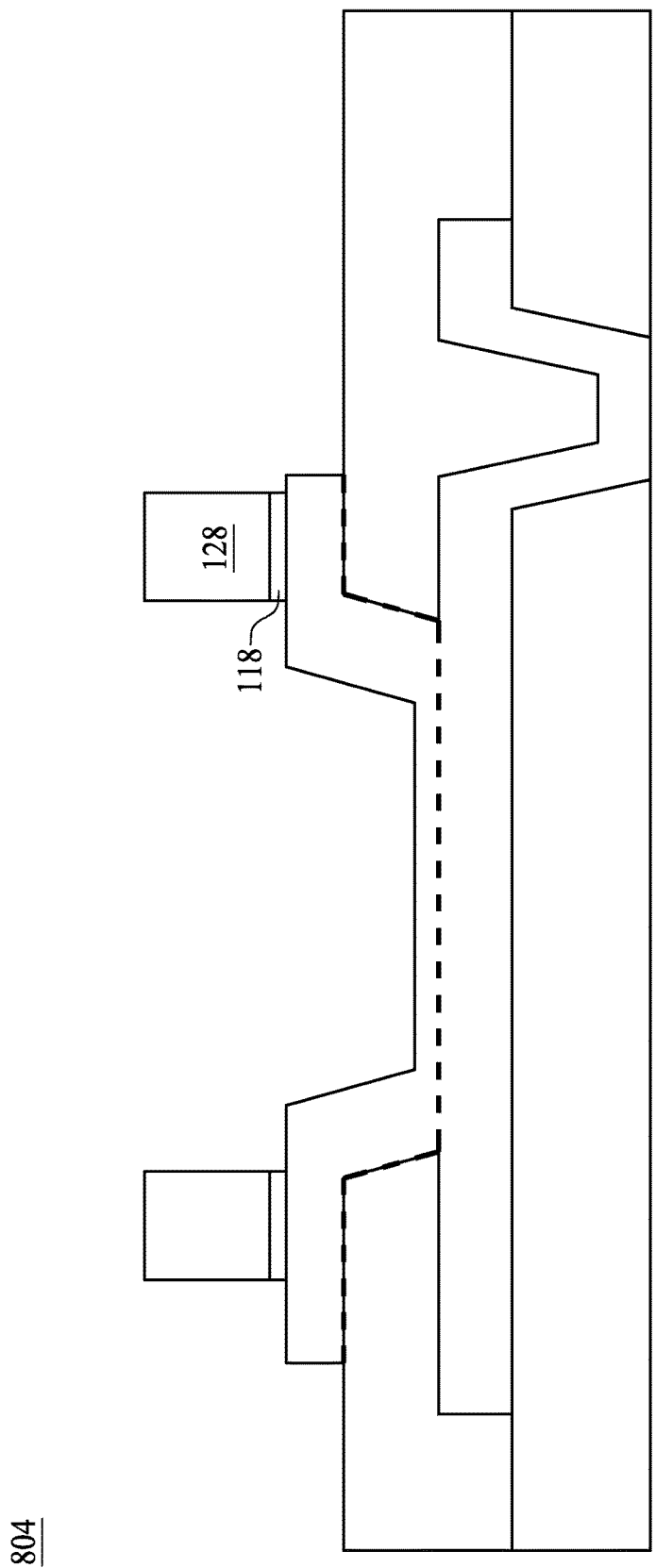
Figure 8E:
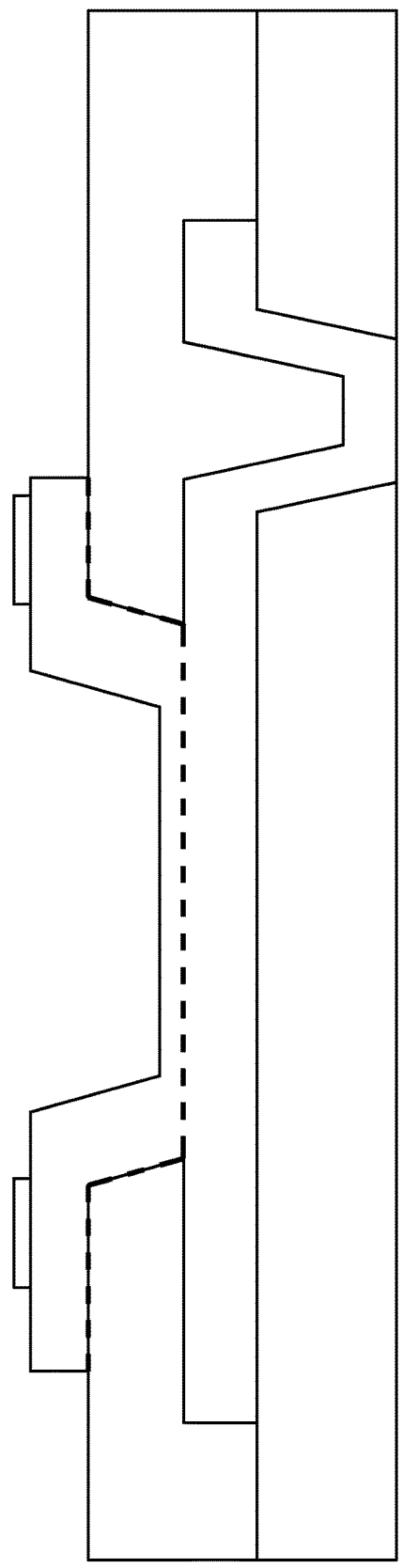
Figure 8F:
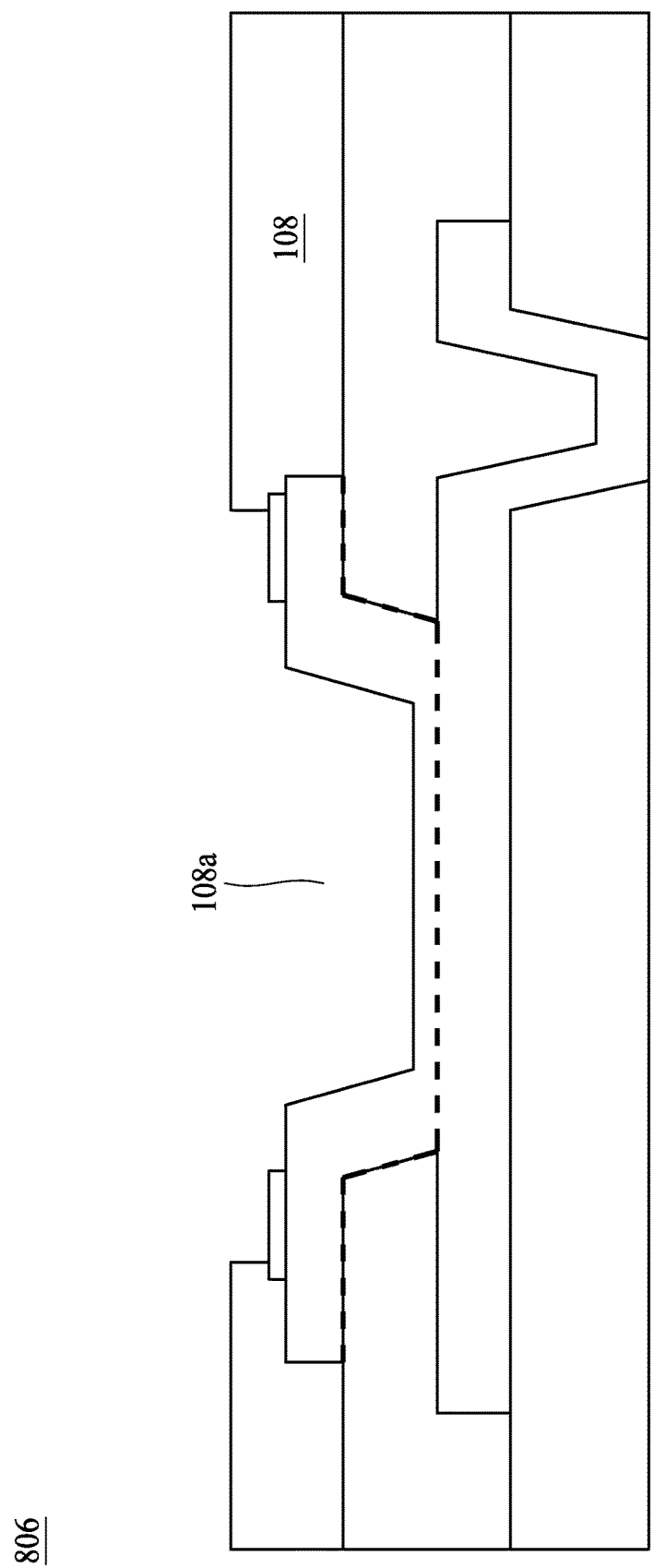
Figure 8G:
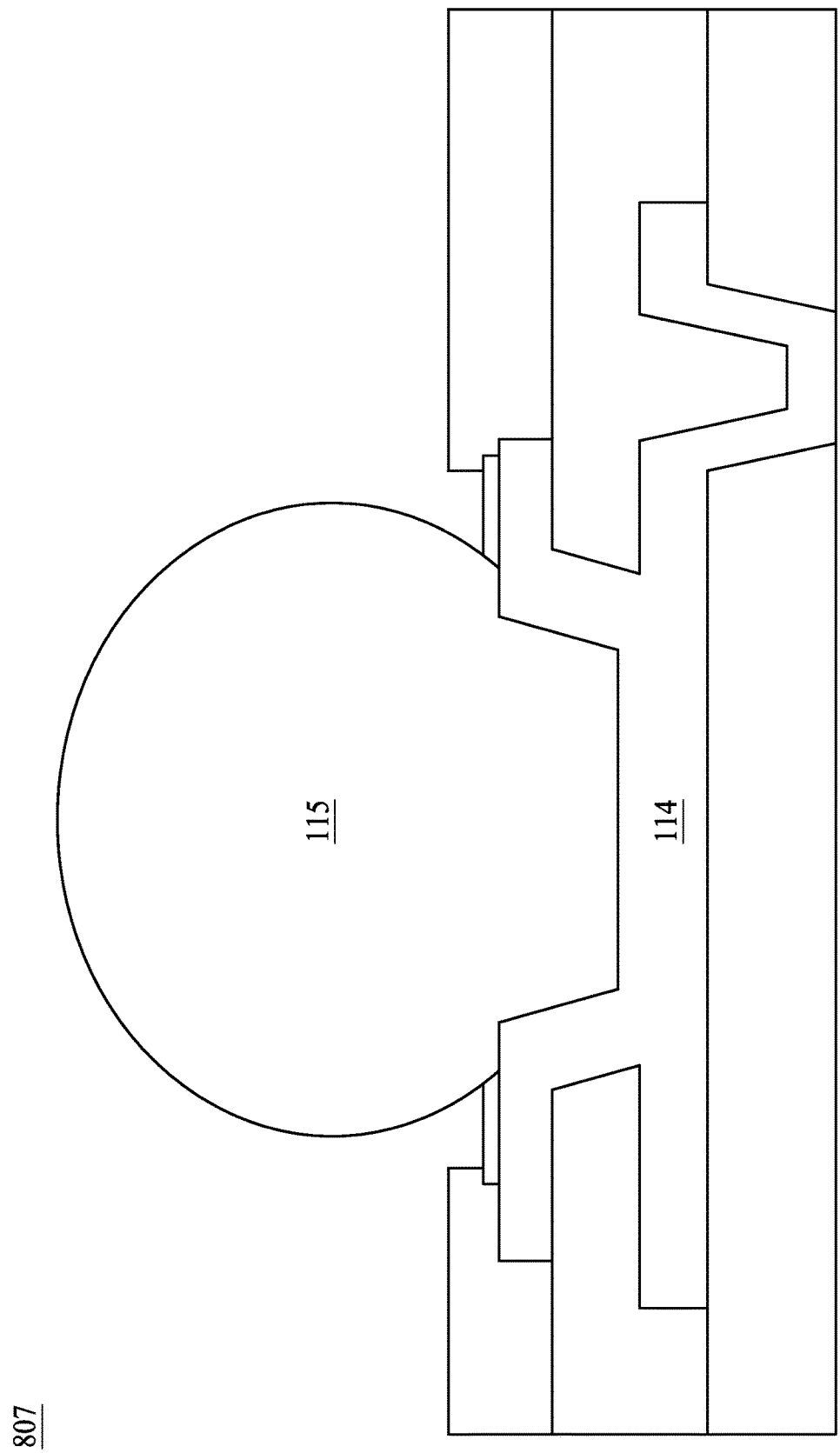

In operation 801, the RDL 114 is disposed as in FIG. 8A. In operation 802, a barrier 118 is disposed on the dielectric 106 and the RDL 114 as in FIG. 8B. In operation 803, a photoresist 128 is disposed on the barrier 118 as in FIG. 8C. In operation 804, some portions of barrier 118 are removed to form a ring-like shape barrier 118 as in FIG. 8D. In operation 805, the photoresist 128 (refers to FIG. 8D) is removed as in FIG. 8E. In operation 806, the dielectric 108 is disposed and an opening 108a is formed as in FIG. 8F. In operation 807, a bump 115 is disposed on the RDL 114 as in FIG. 8G.

In some embodiments, a semiconductor device includes a semiconductor substrate, and a redistribution layer (RDL) over the semiconductor substrate and configured to receive a bump. The semiconductor device further includes a polymeric material over the RDL, and the polymeric material includes an opening to expose a portion of the RDL. In the semiconductor device, a barrier is covering a joint between the polymeric material and the RDL.

In some embodiments, the barrier 118 has an etch resistance greater than the RDL 114 and the polymeric material 108. In some embodiments, the etch rate for the RDL 114 is about 5 times greater than the etch rate of the barrier 118. In some embodiments, the barrier 118 includes Ti, Al, or alloy. In some embodiments, the barrier 118 extends to an interface 116 of the RDL 114 and the polymeric material 108. In some embodiments, a distance between a center line of the bump 115 and a sidewall 114e of the RDL 114 is greater than a distance between the center line of the bump 115 and the outer circle 118b of the barrier 118. In some embodiments, a distance between an inner circle 118a and an outer circle 118b of the barrier 118 is about 10 to 25 um. In some embodiments, an oxide remover is on the portion of the RDL 114 and configured to remove oxide compound thereon for receiving a bump 115, and the oxide remover has an etch selectivity between the oxide compound of the RDL 114 and the barrier 118 or its oxide compound. In some embodiments, the etch selectivity of the oxide remover to the oxide compound of RDL 114 is greater than the etch selectivity of the oxide remover to the barrier 118 or its oxide compound. In some embodiments, the barrier 118 is configured as a seal ring for the RDL 114 and the polymeric material 108. In some embodiments, the oxide remover includes flux. In some embodiments, the barrier 118 has a thickness range from about 50 nm to about 200 nm.

In some embodiments, a method of manufacturing a semiconductor device 100 includes providing a semiconductor substrate 102 and disposing a redistribution layer (RDL) 114 over the semiconductor substrate 102. The method further includes disposing a polymeric material 108 over the RDL 114 and forming an opening 108a on the polymeric material 108 to expose a portion of the RDL 114. The method also includes disposing a barrier 118 covering a joint between the polymeric material 108 and the RDL 114.

In some embodiments, disposing the barrier 118 includes disposing a film on the exposed RDL and the polymeric material and patterning to have the joint covered by the barrier. In some embodiments, the method further includes disposing a bump 115. In some embodiments, the method further includes disposing an oxide remover prior to disposing the bump, and the oxide remover has an etch selectivity between the oxide compound of the RDL 114 and the barrier 118 or its oxide compound.

In some embodiments, a method of manufacturing a semiconductor device includes providing a semiconductor substrate 102 and disposing a redistribution layer (RDL) 114 over the semiconductor substrate 102. The method also includes disposing a barrier 118 surrounding a region on the RDL 114 for receiving a bump 115 and disposing a polymeric material 108 over the RDL 114 and the barrier 118. The method further includes forming an opening 108a on the polymeric material 108 to expose a portion of the RDL 114, and configuring sidewalls of the region as being on the barrier 118.

In some embodiments, the opening 108a is formed in a tapered configuration. In some embodiments, the method further includes disposing an oxide remover on the exposed RDL prior to forming a bump 115 on the exposed RDL. In some embodiments, the oxide remover has an etch selectivity between the oxide compound of the RDL 114 and the barrier 118 or its oxide compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a redistribution layer (RDL) over the semiconductor substrate, and configured to receive a bump;
   a polymeric material over the RDL, wherein the polymeric material includes an opening to expose a portion of the RDL; and
   a barrier covering a joint between the polymeric material and the RDL, wherein the barrier partially exposes the portion of RDL exposed from the opening of the polymeric material.

2. The semiconductor device of claim 1, wherein the barrier comprises an etch resistance greater than the RDL and the polymeric material.

3. The semiconductor device of claim 2, wherein the etch rate for the RDL is about 5 times greater than the etch rate of the barrier.

4. The semiconductor device of claim 1, wherein the barrier comprises Ti, Al, or alloy.

5. The semiconductor device of claim 1, wherein the barrier extends to an interface of the RDL and the polymeric material.

6. The semiconductor device of claim 1, wherein a distance between a center line of the bump and a sidewall of the RDL is greater than a distance between the center line of the bump and the outer circle of the barrier.

7. The semiconductor device of claim 1, wherein a distance between an inner circle and an outer circle of the barrier is about 10 to 25 um.

8. The semiconductor device of claim 1, wherein an oxide remover is on the portion of the RDL and configured to remove oxide compound thereon for receiving the bump, and the oxide remover has an etch selectivity between the oxide compound of the RDL and the barrier or its oxide compound.

9. The semiconductor device of claim 8, wherein the etch selectivity of the oxide remover to the oxide compound of RDL is greater than the etch selectivity of the oxide remover to the barrier or its oxide compound.

10. The semiconductor device of claim 9, wherein the barrier is configured as a seal ring for the RDL and the polymeric material.

11. The semiconductor device of claim 8, wherein the oxide remover includes flux.

12. The semiconductor device of claim 1, wherein the barrier has a thickness range from about 50 nm to about 200 nm.

13. The semiconductor device of claim 1, wherein the barrier extends to a top surface of the polymeric material.

14. The semiconductor device of claim 1, wherein the barrier comprises an inner circle and a distance between the inner circle and the joint is about 10 to 25 um.

15. A semiconductor device, comprising:
   a semiconductor substrate;
   a redistribution layer (RDL) over the semiconductor substrate, and configured to receive a bump;
   a polymeric material over the RDL, wherein the polymeric material includes an opening to expose a portion of the RDL; and
   a barrier sandwiched between the RDL and the polymeric material, wherein the barrier further extends to the opening,
   wherein the bump is only in contact with a sidewall and not in contact with a top surface of the barrier.

16. The semiconductor device of claim 15, wherein the barrier is selected from a material which is more passive to the material used for the bump than the RDL.

17. The semiconductor device of claim 15, wherein the barrier is surrounding the bump.

* * * * *